United States Patent
Sumida

(10) Patent No.: US 7,807,531 B2
(45) Date of Patent: Oct. 5, 2010

(54) SEMICONDUCTOR DEVICE HAVING TRENCH-TYPE GATE AND ITS MANUFACTURING METHOD CAPABLE OF SIMPLIFYING MANUFACTURING STEPS

(75) Inventor: Wataru Sumida, Shiga (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/453,551

(22) Filed: May 14, 2009

(65) Prior Publication Data

US 2009/0227102 A1  Sep. 10, 2009

Related U.S. Application Data

(62) Division of application No. 11/798,930, filed on May 17, 2007, now Pat. No. 7,564,098.

(30) Foreign Application Priority Data

May 18, 2006 (JP) ............................. 2006-139588

(51) Int. Cl.
*H01L 21/336* (2006.01)
(52) U.S. Cl. ........................ 438/259; 438/270; 438/272; 257/E21.41
(58) Field of Classification Search ................. 438/259, 438/270, 272; 257/E21.41
See application file for complete search history.

(56) References Cited

U.S. PATENT DOCUMENTS

| 6,489,652 | B1 | 12/2002 | Jeon et al. | |
| 7,049,657 | B2 | 5/2006 | Matsuda | |
| 7,268,392 | B2 | 9/2007 | Shibata et al. | |
| 2005/0218447 | A1 | 10/2005 | Darwish | |
| 2005/0236665 | A1 | 10/2005 | Darwish et al. | |
| 2006/0049455 | A1 | 3/2006 | Jang et al. | |
| 2006/0086972 | A1 | 4/2006 | Shibata et al. | |
| 2006/0273386 | A1 | 12/2006 | Yilmaz et al. | |
| 2009/0111227 | A1* | 4/2009 | Kocon et al. | 438/259 |
| 2009/0291541 | A1* | 11/2009 | Jang et al. | 438/270 |
| 2010/0087039 | A1* | 4/2010 | Hshieh | 438/270 |

FOREIGN PATENT DOCUMENTS

| JP | 11-163342 | 6/1999 |
| JP | 2001-127072 | 5/2001 |
| JP | 2002-158355 | 5/2002 |

* cited by examiner

*Primary Examiner*—Ngan Ngo
(74) *Attorney, Agent, or Firm*—McGinn IP Law Group, PLLC

(57) ABSTRACT

In a semiconductor device, a gate silicon dioxide layer is formed within a trench of a semiconductor wafer. A first gate electrode is formed on a sidewall of the trench of the semiconductor wafer via the gate silicon dioxide layer. An insulating layer is formed on a bottom of the trench of the semiconductor wafer via the gate silicon dioxide layer and surrounded by the first gate electrode. The insulating layer excludes silicon dioxide and has different etching characteristics from those of silicon dioxide. A second gate electrode is buried in the trench of the semiconductor wafer, and is in contact with the first gate electrode and the insulating layer.

5 Claims, 27 Drawing Sheets

SEMICONDUCTOR DEVICE HAVING TRENCH-TYPE GATE AND ITS MANUFACTURING METHOD CAPABLE OF SIMPLIFYING MANUFACTURING STEPS

The present Application is a Divisional Application of U.S. patent application Ser. No. 11/798,930, filed on May 17, 2007 now U.S. Pat. No. 7,564,098.

BACKGROUND OF THE INVENTION

1. Field of the Invention

The present invention relates to a semiconductor device such as a vertical MOS field effect transistor (MOSFET) having a trench-type gate and an insulating gate bipolar transistor (IGBT) and its manufacturing method.

2. Description of the Related Art

In view of the high-integration and the low ON-resistance, trench-type vertical MOSFETs have been developed.

A first prior art trench-type vertical MOSFET with a low breakdown voltage such as 20 to 60V includes an n⁻-type epitaxial layer grown on an n⁺-type monocrystalline silicon substrate. The n⁻-type epitaxial layer is formed by an n⁻-type drain region, a p-type base region and an n⁺-type source region. Also, a U-shaped trench is formed within the epitaxial layer, and a gate silicon dioxide layer is thermally grown within the U-shaped trench. Further, a gate electrode is buried in the U-shaped trench on the gate silicon dioxide layer (see: FIG. 8 of JP-2002-158355A). This will be explained later in detail.

Since the above-described first prior art trench-type vertical MOSFET has a low breakdown voltage such as 20 to 60V, even when the distance between portions of the p-type base region on the sides of the U-shaped trench, i.e., the width of the trench is small, the ON-resistance of the p-type base region can be sufficiently low. Therefore, in this case, no problem occurs.

In a second prior art trench-type vertical MOSFET with a medium breakdown voltage such as 150 to 250V, the p-type base region is deeper. Therefore, if the width of the U-shaped trench is large, the ON-resistance of the p-type base region is increased. In order to decrease this ON-resistance, the width of the trench is larger (see: FIG. 7 of JP-2002-158355A). This also will be explained later in detail.

In the above-described second prior art trench-type vertical MOSFET, however, the gate electrode is overetched. As a result, since a channel may not be normally generated within the p-type base region, the above-described second prior art trench-type vertical MOSFET would not be normally operated.

In a third prior art trench-type vertical MOSFET, in order to avoid the overetching of the gate electrode, the gate electrode is formed by a double gate, i.e., a first gate electrode, a silicon dioxide layer and a second gate electrode (see: FIG. 1 of JP-2002-158355A). This also will be explained later in detail.

In the above-described third prior art trench-type vertical MOSFET, however, since the gate silicon dioxide layer is so thin to decrease the ON-resistance of the p-type base region and increase the driving ability, the static gate-to-drain capacitance $C_{gd}$ is increased, which would decrease the switching operation speed.

In a fourth prior art trench-type vertical MOSFET, the gate silicon dioxide layer is modified to be made thicker at the bottom of the U-shaped trench than at the side of the U-shaped trench (see: FIG. 11 of JP-2001-127072A). As a result, the static gate-to-drain capacitance $C_{gd}$ is decreased to increase the switching operation speed. This also will be explained later in detail.

In the above-described fourth prior art trench-type vertical MOSFET, however, when a gate voltage is applied to the gate electrode, a channel is hardly generated in the p-type base region in the vicinity of the bottom of the U-shaped trench. As a result, the ON-resistance is increased.

In a fifth prior art trench-type vertical MOSFET, in order to effectively generate a channel in the p-type base region in the vicinity of the bottom of the U-shaped trench, a first gate electrode is formed on the side of the U-shaped trench via the gate silicon dioxide layer, and an additional gate silicon dioxide layer is formed at the bottom of the U-shaped trench via the gate silicon dioxide layer. Also, a second gate electrode is formed and is in contact with the first gate electrode and the additional gate silicon dioxide layer. Since the additional gate silicon dioxide layer is added to the gate silicon dioxide layer at the bottom of the U-shaped trench, the static gate-to-drain capacitance $C_{gd}$ is decreased, which would increase the switching operation speed. Also, since the first gate electrode reaches the bottom of the U-shaped trench, a channel can effectively be generated in the p-type base region in vicinity of the bottom of the U-shaped trench (see: FIG. 1 of JP-11-163342A).

SUMMARY OF THE INVENTION

However, the method for manufacturing the above-described fifth prior art MOSFET is so complex that the manufacturing cost would be high. Particularly, the first gate electrode is formed by an etching back process, a photolithography process and an etching process, which would make the manufacturing steps complex. Also, the second gate electrode is formed by an etching back process without an etching stopper, which would overetch the epitaxial layer.

According to the present invention, in a semiconductor device, a gate silicon dioxide layer is formed within a trench of a semiconductor wafer. A first gate electrode is formed on a sidewall of the trench of the semiconductor wafer via the gate silicon dioxide layer. An insulating layer is formed on a bottom of the trench of the semiconductor wafer via the gate silicon dioxide layer and surrounded by the first gate electrode. The insulating layer excludes silicon dioxide and has different etching characteristics from those of silicon dioxide. A second gate electrode is buried in the trench of the semiconductor wafer, and is in contact with the first gate electrode and the insulating layer.

Also, in a method for manufacturing a semiconductor device, a trench is formed in a semiconductor wafer. Then, a gate silicon dioxide layer is formed on an entire surface of the semiconductor wafer. Then, a first gate layer is deposited on the gate silicon dioxide layer. Then, the first gate layer is etched back to form a first gate electrode on a sidewall of the trench of the semiconductor wafer via the gate silicon dioxide layer. Then, an insulating layer is deposited on an entire surface of the semiconductor wafer. In this case, the insulating layer excludes silicon dioxide and has different etching characteristics from those of silicon dioxide. Then, the insulating layer is etched back by using the gate silicon dioxide layer as an etching stopper, so that the insulating layer is left on a bottom of the trench of the semiconductor wafer via the gate silicon dioxide layer and is surrounded by the first gate electrode. Then, a second gate electrode layer is formed on an entire surface of the semiconductor wafer. Finally, the second gate electrode layer is etched back by using the gate silicon dioxide layer as an etching stopper to form a second gate electrode buried in the trench of the semiconductor wafer. The second gate electrode is in contact with the first gate electrode and the insulating layer.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, prior art trench-type vertical MOSFETs will be explained with reference to FIGS. 1, 2, 3A, 3B, 4, 5, 6 and 7A through 7J.

Figure 1:
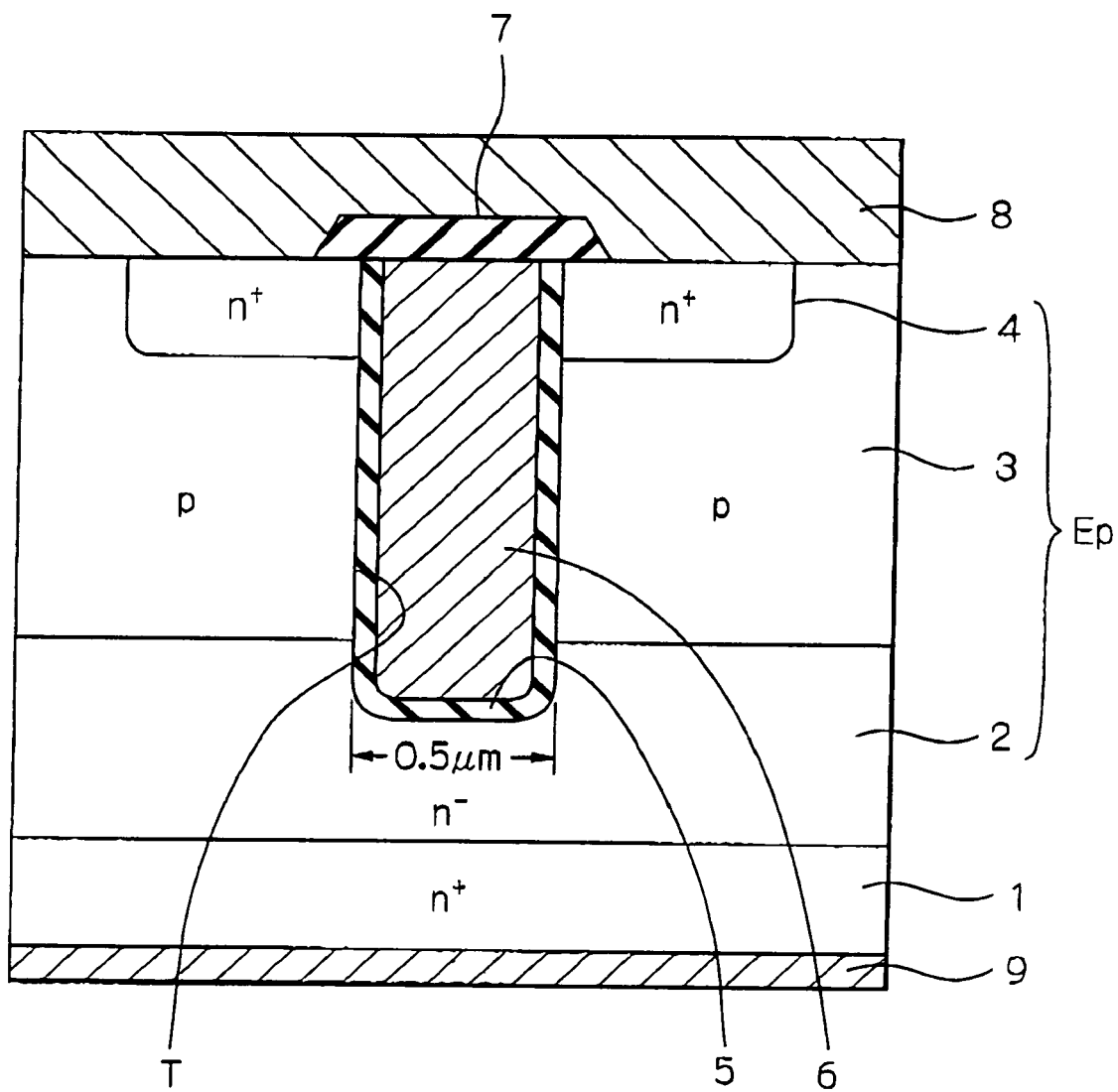
FIG. 1 is a cross-sectional view illustrating a first prior art trench-type vertical MOSFET.
Figure 8:
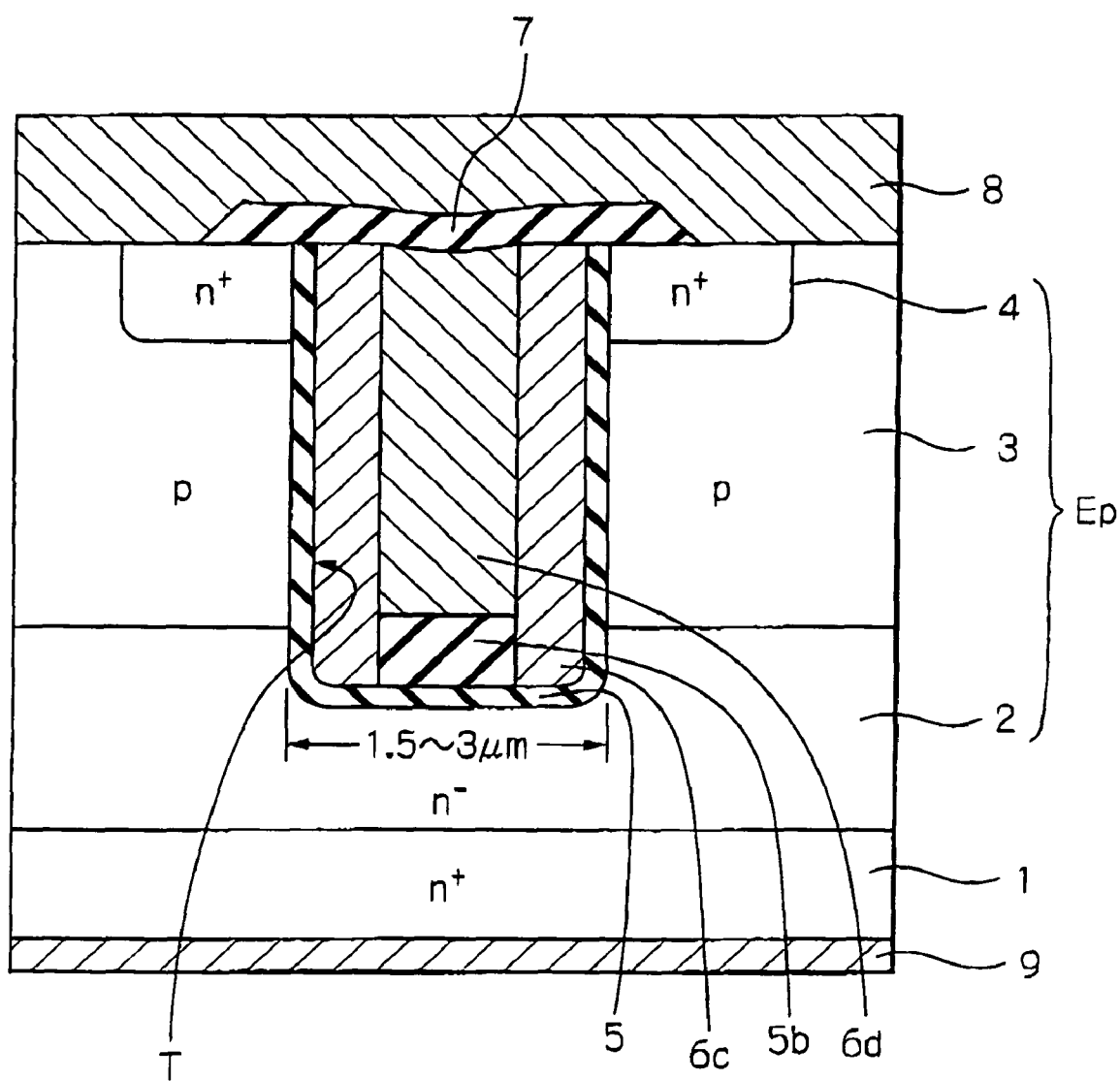
FIG. 8 is a cross-sectional view illustrating an embodiment of the trench-type vertical MOSFET according to the present invention.

In FIG. 1, which illustrates a first prior art trench-type vertical MOSFET (see: FIG. 8 of JP-2002-158355A), this trench-type vertical MOSFET has a low breakdown voltage such as 20 to 60V. That is, an n⁻-type epitaxial layer $E_P$ is grown on an n⁺-type monocrystalline silicon substrate 1. Then, a p-type base region 3 and an n⁺-type source region 4 are formed by implanting p-type impurities and n-type impurities, respectively, into the n⁻-type epitaxial layer $E_P$. In this case, the un-implanted n⁻-type epitaxial layer $E_P$ is defined as an n⁻-type drain region 2. Then, a U-shaped trench T is formed within the epitaxial layer $E_P$. That is, the U-shaped trench T penetrates from the n⁺-type source region 4 via the p-type base region 3 to reach the n⁻-type drain region 2. Then, a gate silicon dioxide layer 5 is thermally grown within the U-shaped trench T. Then, a gate electrode 6 is buried in the U-shaped trench T on the gate silicon dioxide layer 5. Then, an insulating interlayer 7 is formed on the gate electrode 6. Finally, a source electrode 8 and a drain electrode 9 are formed on the front side and the back side, respectively. Note that, the p-type base region 3 and the n⁺-type source region 4 can be formed after the formation of the U-shaped trench T.

Since the trench-type vertical MOSFET of FIG. 1 has a low breakdown voltage such as 20 to 60V, even when the distance between portions of the p-type base region 3 on the sides of the U-shaped trench T, i.e., the width of the trench T is small, for example, about 0.5 μm, the ON-resistance of the p-type base region 3 can be sufficiently low. Therefore, in this case, no problem occurs.

Figure 2:
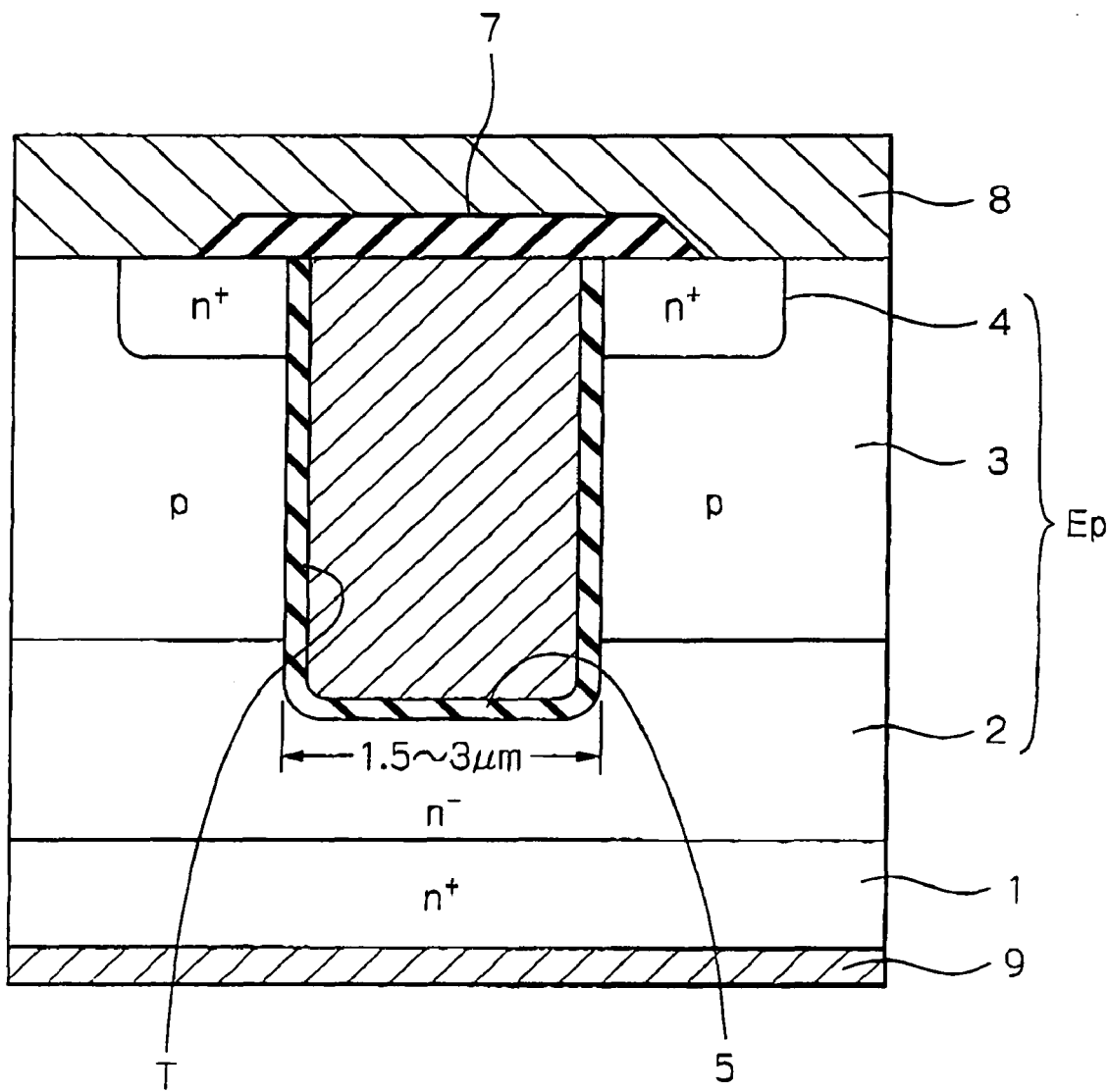
FIG. 2 is a cross-sectional view illustrating a second prior art trench-type vertical MOSFET.

In FIG. 2, which illustrates a second prior art trench-type vertical MOSFET (see: FIG. 7 of JP-2002-158355A), this trench-type vertical MOSFET has a medium breakdown voltage such as 150 to 250V. In this case, the p-type base region 3 is deeper in FIG. 2 than in FIG. 1. Therefore, if the width of the U-shaped trench T is larger, the ON-resistance of the p-type base region 3 is increased. In order to decrease this ON-resistance, the width of the trench T is larger in FIG. 2 than in FIG. 1. For example, the width of the trench T is about 1.5 to 3.0 μm.

A method for manufacturing the trench-type vertical MOSFET of FIG. 2 is explained next with reference to FIGS. 3A and 3B (see: FIGS. 13 and 14 of JP-2002-158355A).

Figure 3A:
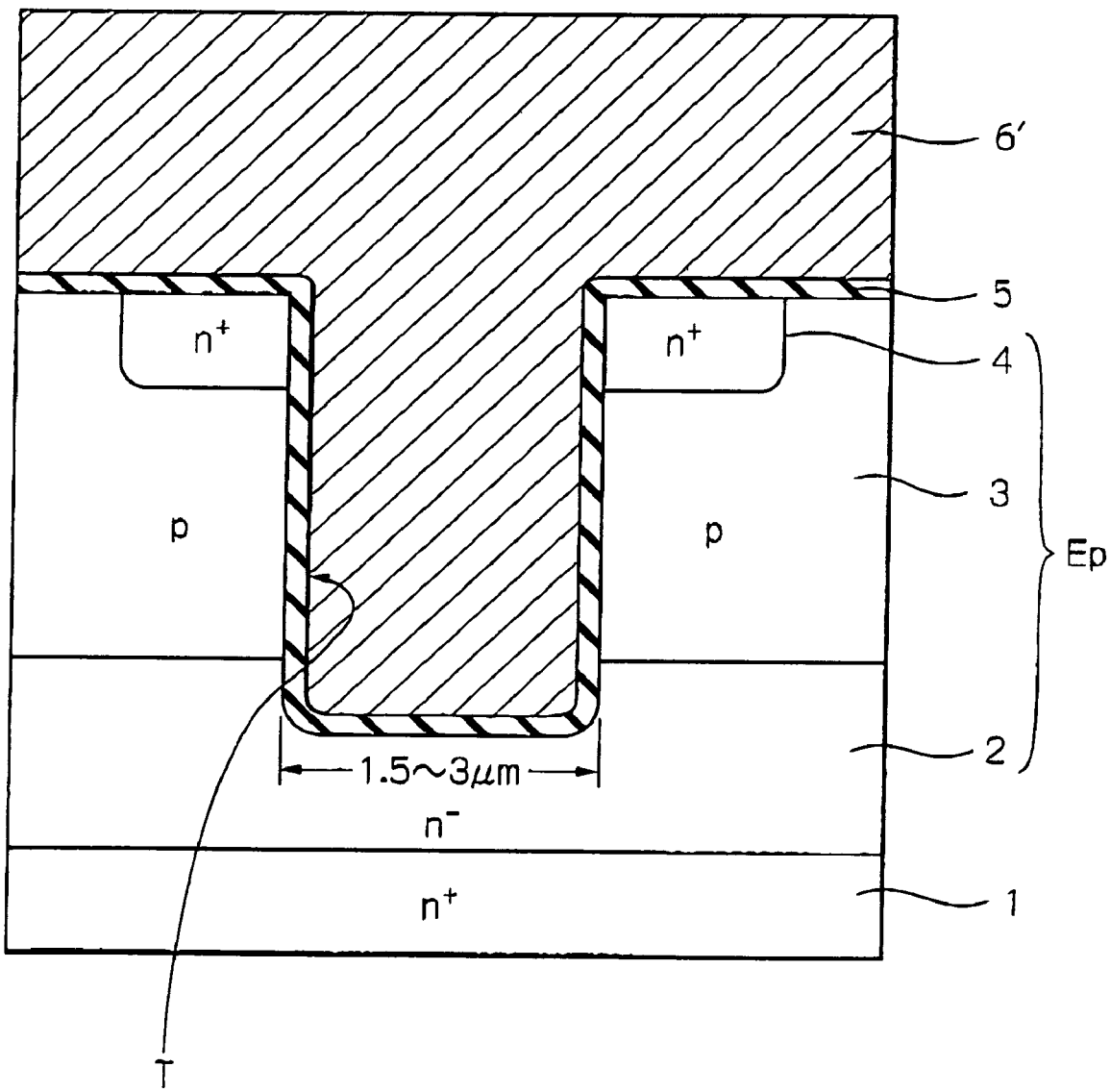
FIGS. 3A and 3B are cross-sectional views for explaining a method for manufacturing the MOSFET of FIG. 2.

Referring to FIG. 3A, after a U-shaped trench T is formed within an epitaxial layer $E_P$, a gate silicon dioxide layer 5 is thermally grown thereon. Then, a sufficiently-thick polycrystalline silicon layer 6' is deposited on the entire surface by a chemical vapor deposition (CVD) process.

Figure 3B:
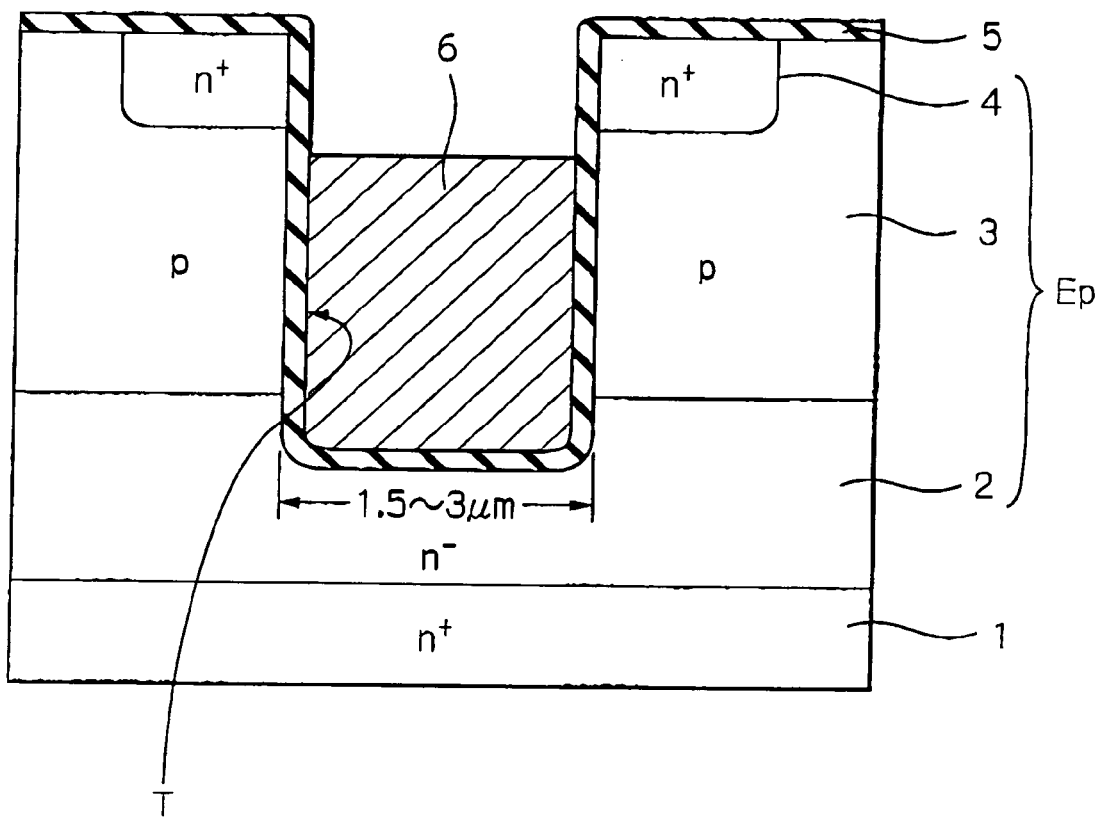

Next, referring to FIG. 3B, the polycrystalline silicon layer 6' is etched back by an anisotropic etching process to obtain a gate electrode 6 within the U-shaped trench T.

In the manufacturing method as illustrated in FIGS. 3A and 3B, however, the gate electrode 6 is overetched. As a result, since a channel may not be normally generated within the p-type base region 3, the trench-type vertical MOSFET of FIG. 2 would not be normally operated.

Figure 4:
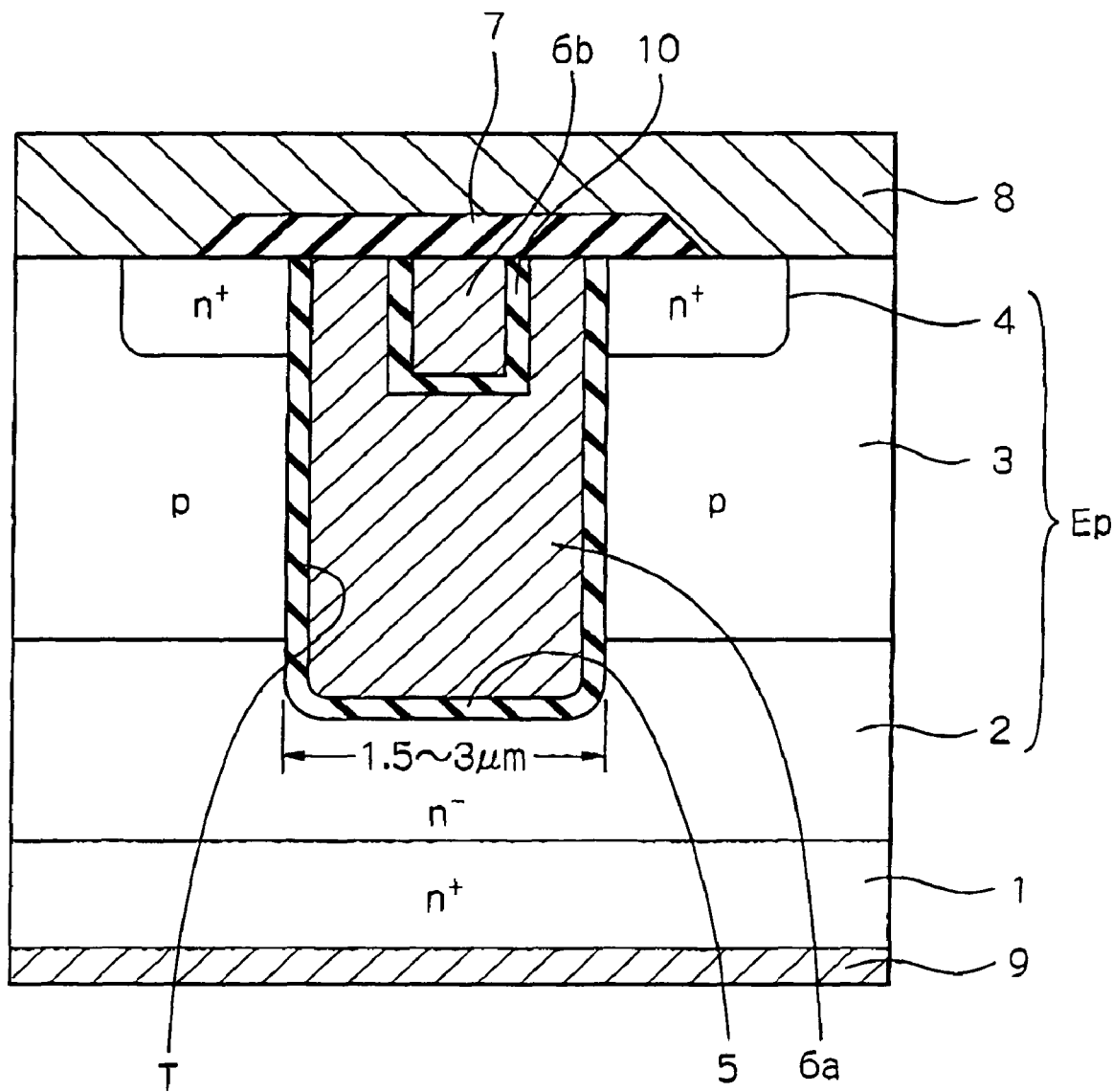
FIG. 4 is a cross-sectional view illustrating a third prior art trench-type vertical MOSFET.

In FIG. 4, which illustrates a third prior art trench-type vertical MOSFET (see: FIG. 1 of JP-2002-158355A), this prior art trench-type vertical MOSFET also has a medium breakdown voltage such as 150 to 250V. In FIG. 4, in order to avoid the overetching of the gate electrode 6 of FIG. 2, the gate electrode 6 of FIG. 2 is replaced by a gate electrode 6a, a silicon dioxide layer 10 and a gate electrode 6b.

In the trench-type vertical MOSFET of FIG. 4, however, since the gate silicon dioxide layer 5 is so thin to decrease the ON-resistance of the p-type base region 3 and increase the driving ability, the static gate-to-drain capacitance $C_{gd}$ is increased, which would decrease the switching operation speed.

Figure 5:
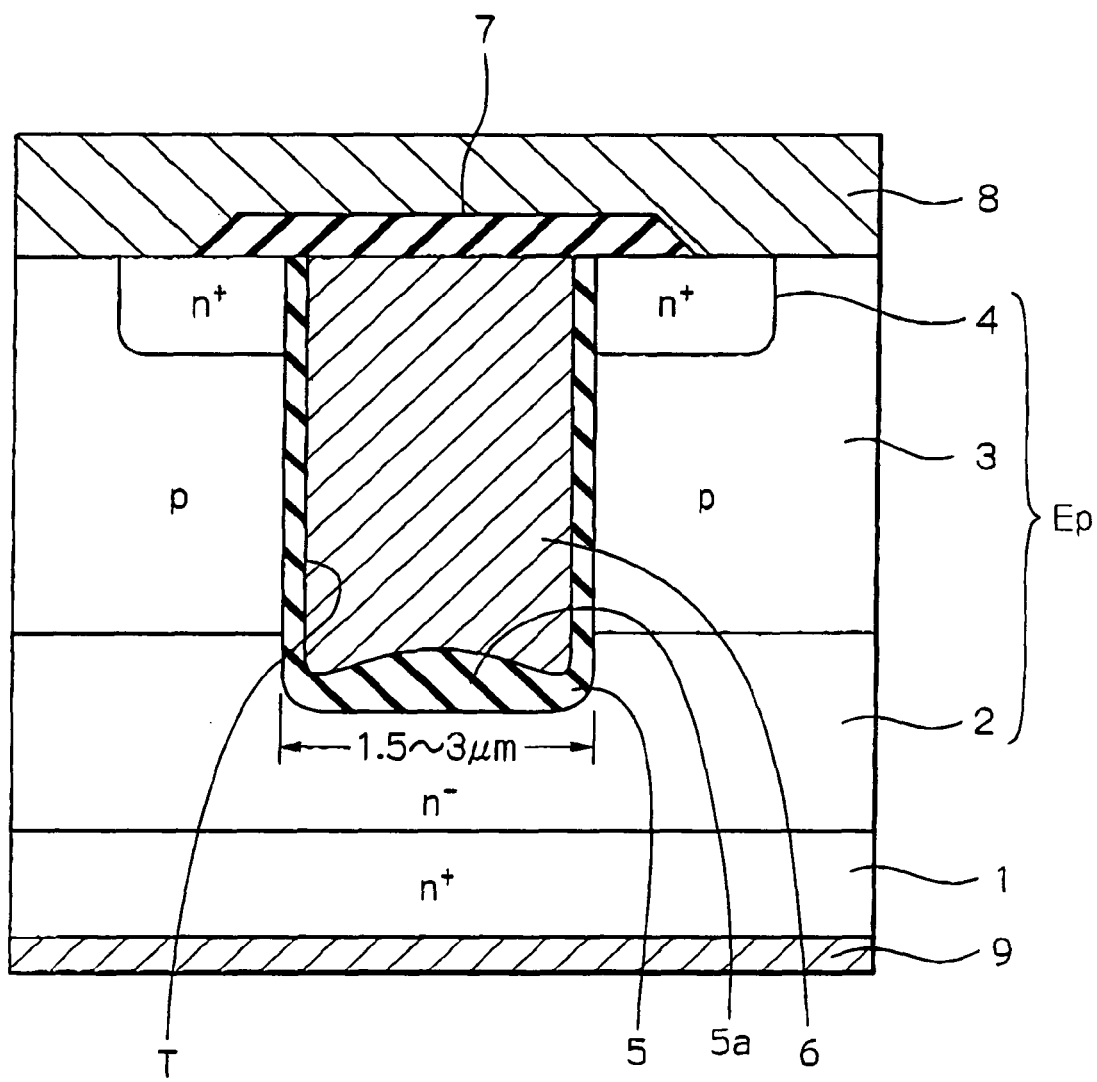
FIG. 5 is a cross-sectional view illustrating a fourth prior art trench-type vertical MOSFET.

In FIG. 5, which illustrates a fourth prior art trench-type vertical MOSFET (see: FIG. 11 of JP-2001-127072A), the gate silicon dioxide layer 5 of FIG. 2 is modified to be made thicker at the bottom of the U-shaped trench T than at the side of the U-shaped trench T. That is, a bottom portion 5a of the gate silicon dioxide layer 5, which would not affect the formation of a channel within the p-type base region 3, is made thicker. As a result, the static gate-to-drain capacitance $C_{gd}$ is decreased to increase the switching operation speed.

In the trench-type vertical MOSFET of FIG. 5, however, when a gate voltage is applied to the gate electrode 6, a channel is hardly generated in the p-type base region 3 in the vicinity of the bottom of the U-shaped trench T. That is, a charge storage region opposite to the gate voltage is hardly generated in the p-type base region 3 in the vicinity of the bottom of the U-shaped trench T. As a result, the ON-resistance is increased.

Figure 6:
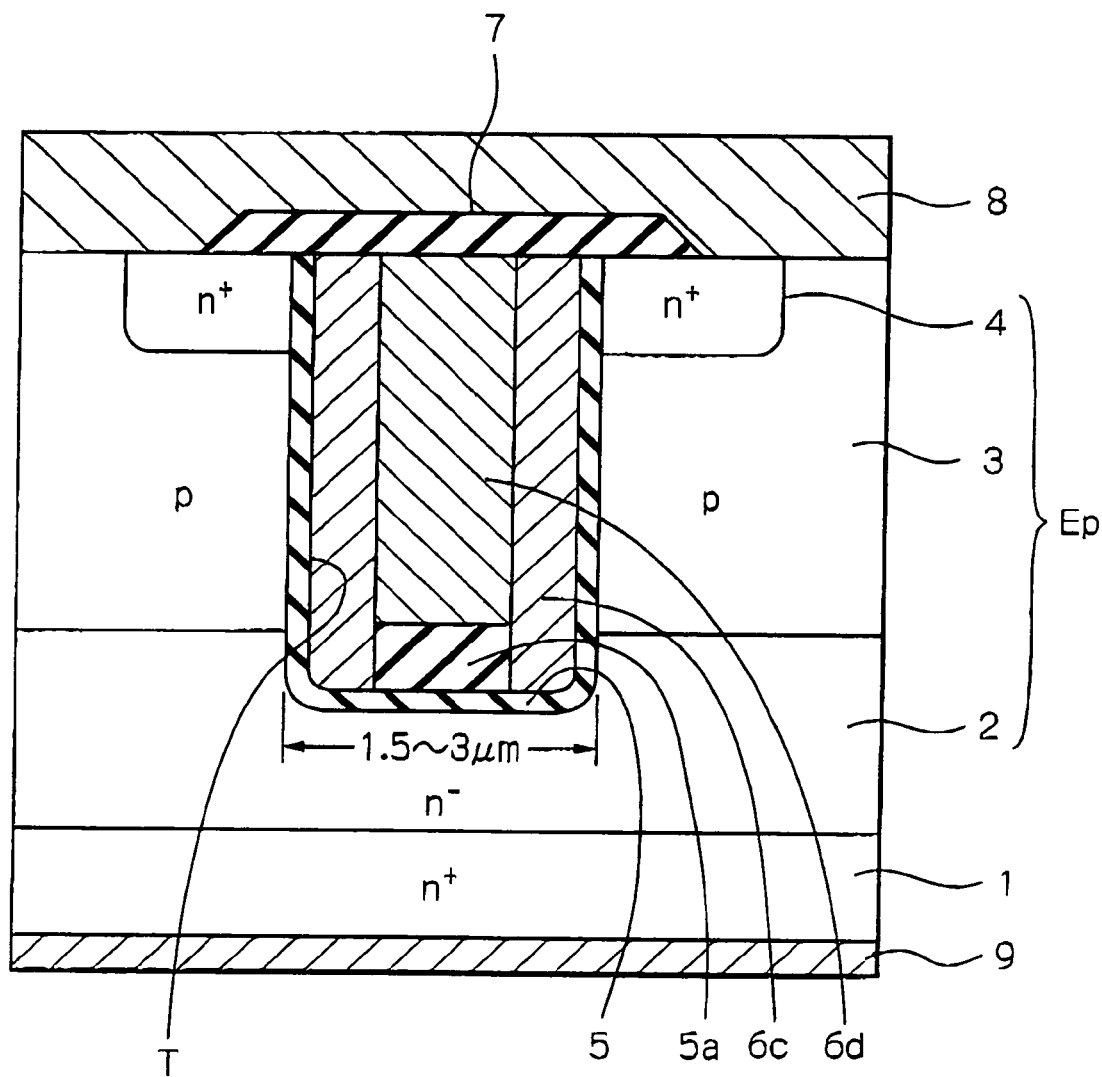
FIG. 6 is a cross-sectional view illustrating a fifth prior art trench-type vertical MOSFET.

In FIG. 6, which illustrates a fifth prior art trench-type vertical MOSFET (see: FIG. 1 of JP-11-163342A), this trench-type vertical MOSFET also has a medium breakdown voltage such as 150 to 250V. In order to effectively generate a channel in the p-type base region 3 in the vicinity of the bottom of the U-shaped trench T upon application of a gate voltage, the gate electrode 6 of FIG. 2 is replaced by a gate electrode 6c formed on the side of the U-shaped trench T via the gate silicon dioxide layer 5, a gate silicon dioxide layer 5a formed at the bottom of the U-shaped trench T via the gate silicon dioxide layer 5 and a gate electrode 6d in contact with the gate electrode 6c and the gate silicon dioxide layer 5a.

In the MOSFET of FIG. 6, since the gate silicon dioxide layer 5a is added to the gate silicon dioxide layer 5 at the bottom of the U-shaped trench T, the static gate-to-drain capacitance $C_{gd}$ is decreased, which would increase the switching operation speed. Also, since the gate electrode 6c reaches the bottom of the U-shaped trench T, a channel can effectively be generated in the p-type base region 3 in vicinity of the bottom of the U-shaped trench T upon application of a gate voltage to the gate electrodes 6c and 6d.

The MOSFET of FIG. 6, however, has a disadvantage in that the manufacturing steps are so complex that the manufacturing cost is high, which is explained next with reference to FIGS. 7A through 7J.

Figure 7A:
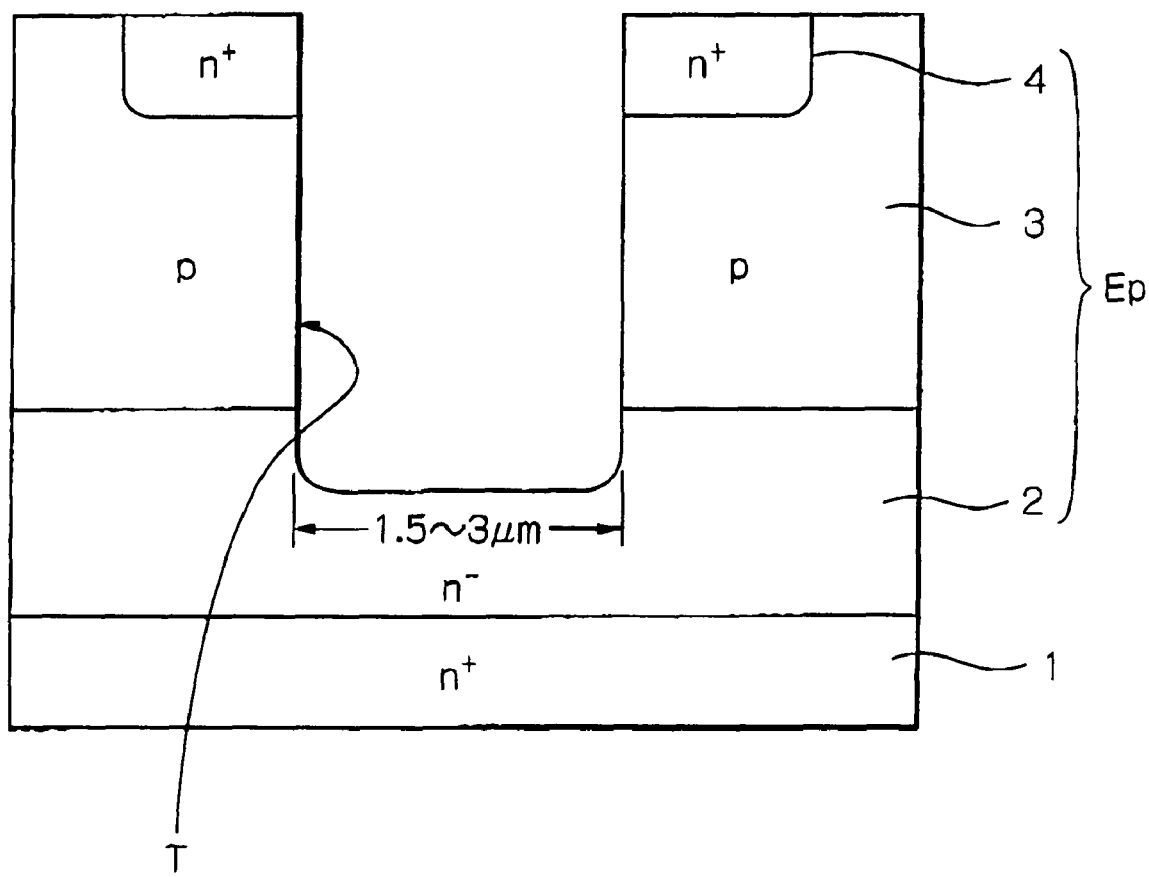
FIGS. 7A through 7J are cross-sectional views for explaining a method for manufacturing the MOSFET of FIG. 6.

First, referring to FIG. 7A, a semiconductor wafer where an epitaxial layer $E_P$ formed by an $n^-$-type drain region 2, a p-type base region 3 and an $n^+$-type source region 4 is formed on an $n^+$-type monocrystalline silicon substrate 1 is prepared. Then, a U-shaped trench T is formed within the epitaxial layer $E_P$.

Figure 7B:
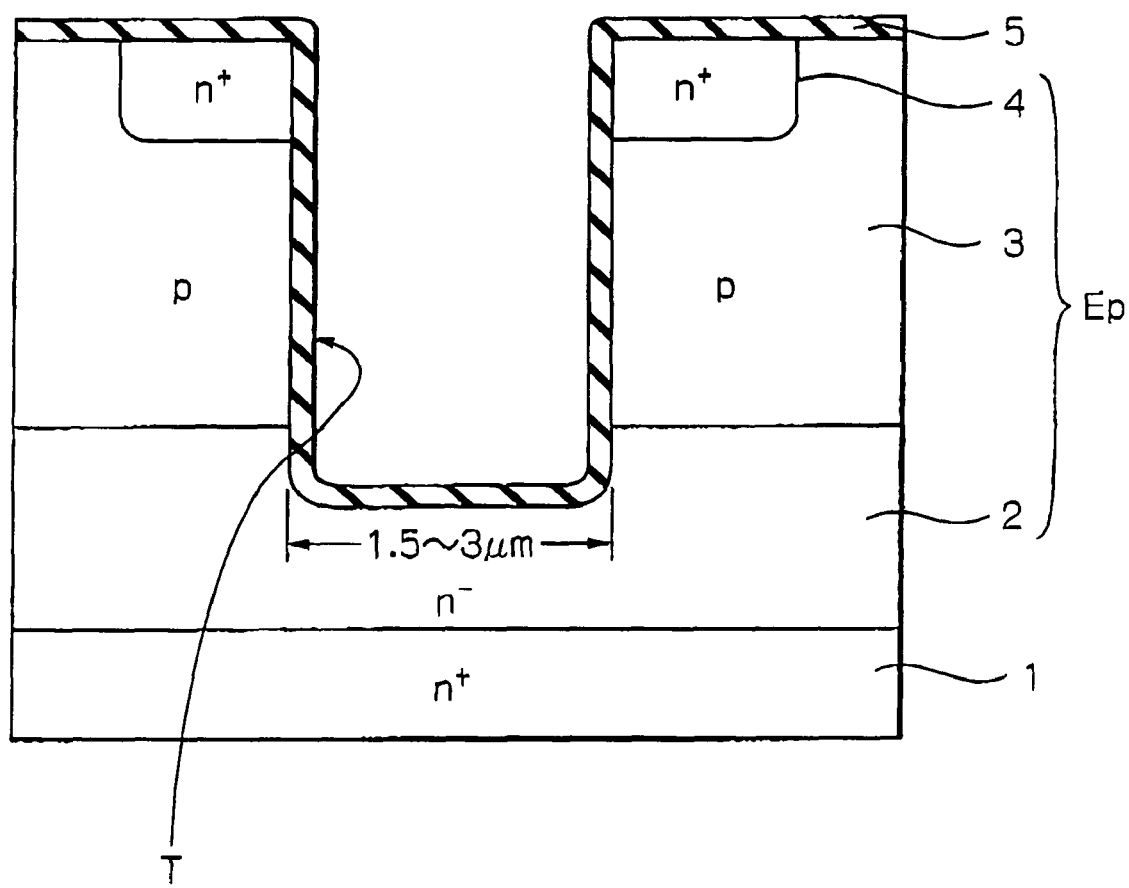

Next, referring to FIG. 7B, a gate silicon dioxide layer 5 is thermally grown on the epitaxial layer $E_P$.

Figure 7C:
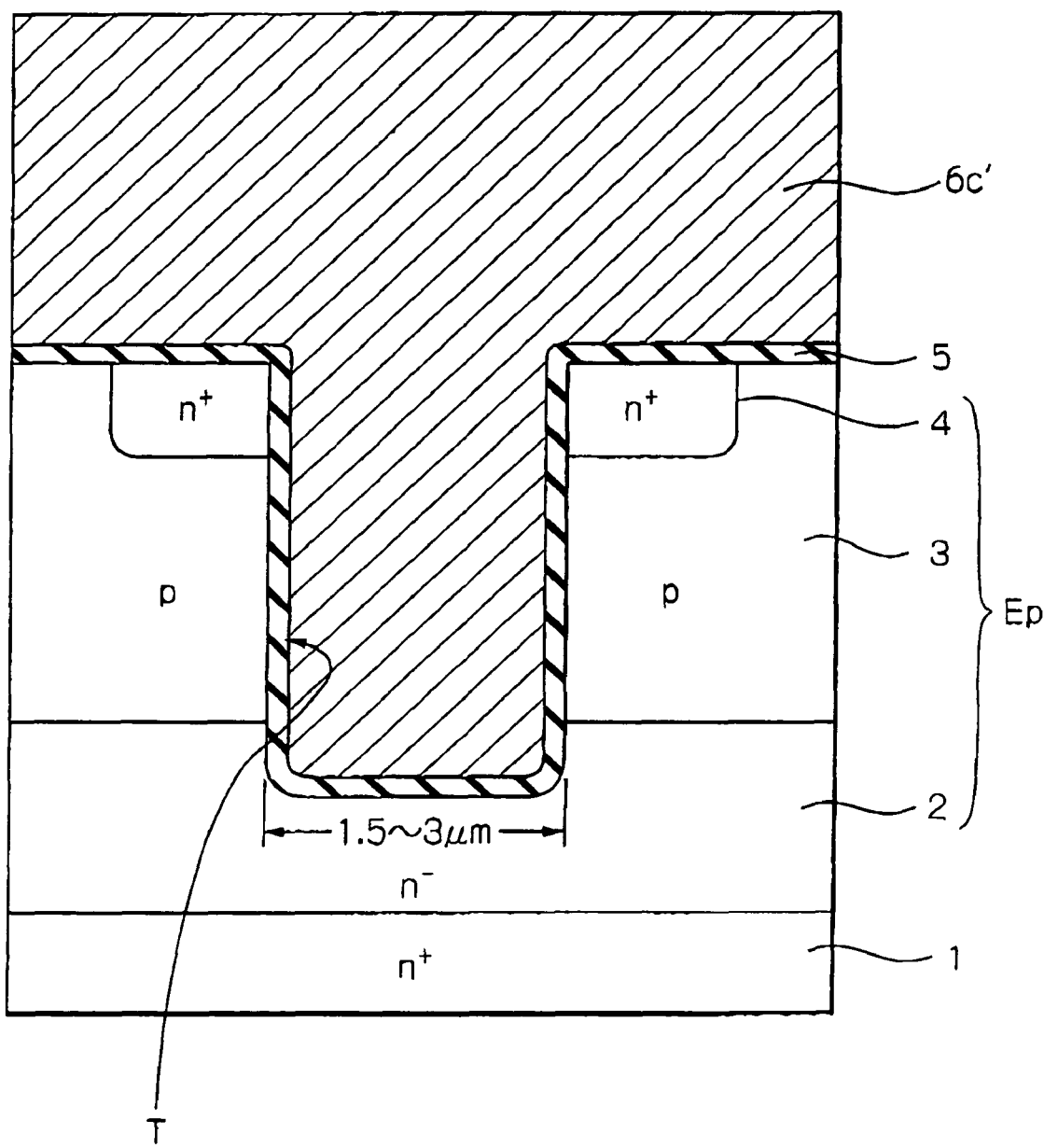

Next, referring to FIG. 7C, a phosphorus-doped polycrystalline silicon layer 6c' is deposited on the gate silicon dioxide layer 5 by a CVD process.

Figure 7D:
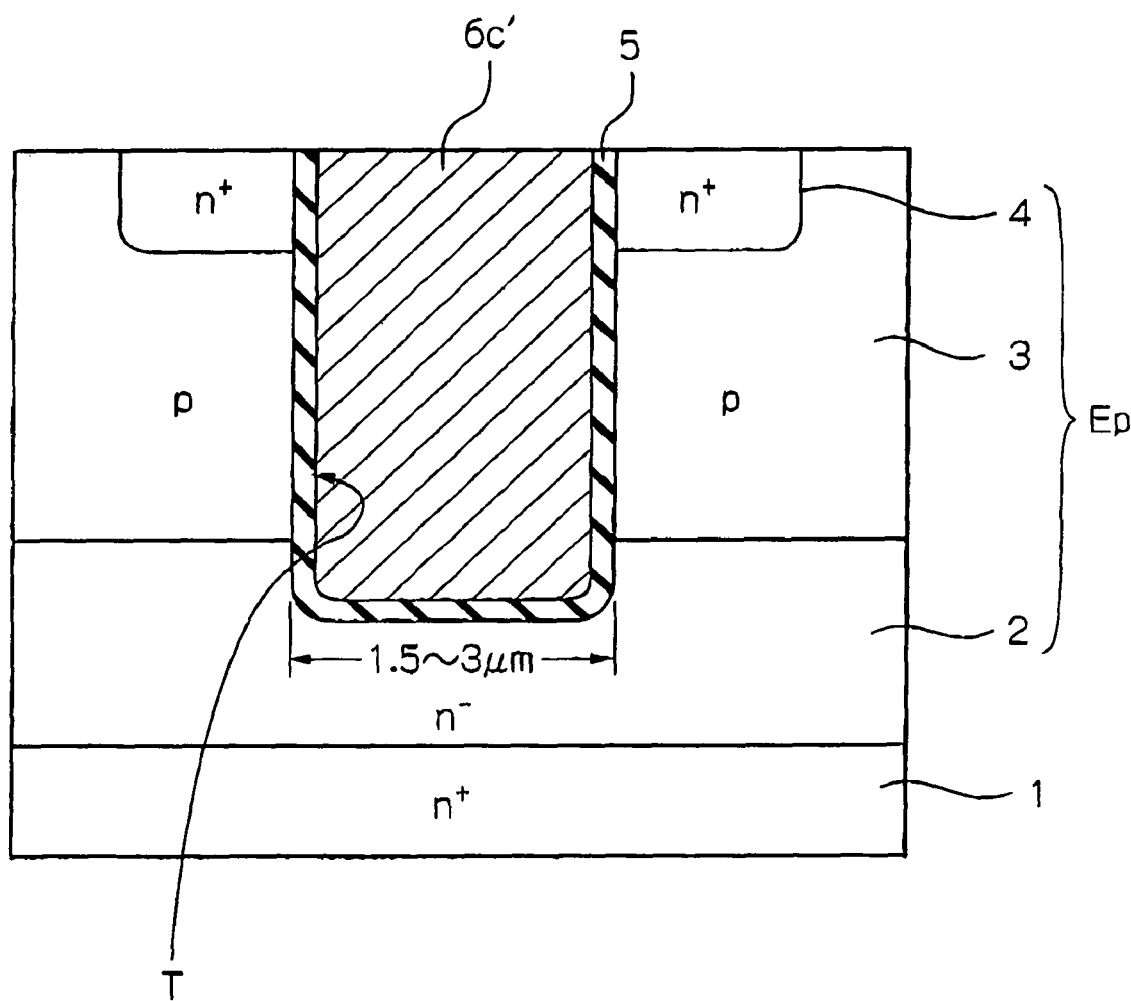

Next, referring to FIG. 7D, the polycrystalline silicon layer 6c' and the gate silicon dioxide layer 5 are etched back by an anisotropic etching process. As a result, the polycrystalline silicon layer 6c' is completely buried in the U-shaped trench T.

Figure 7E:
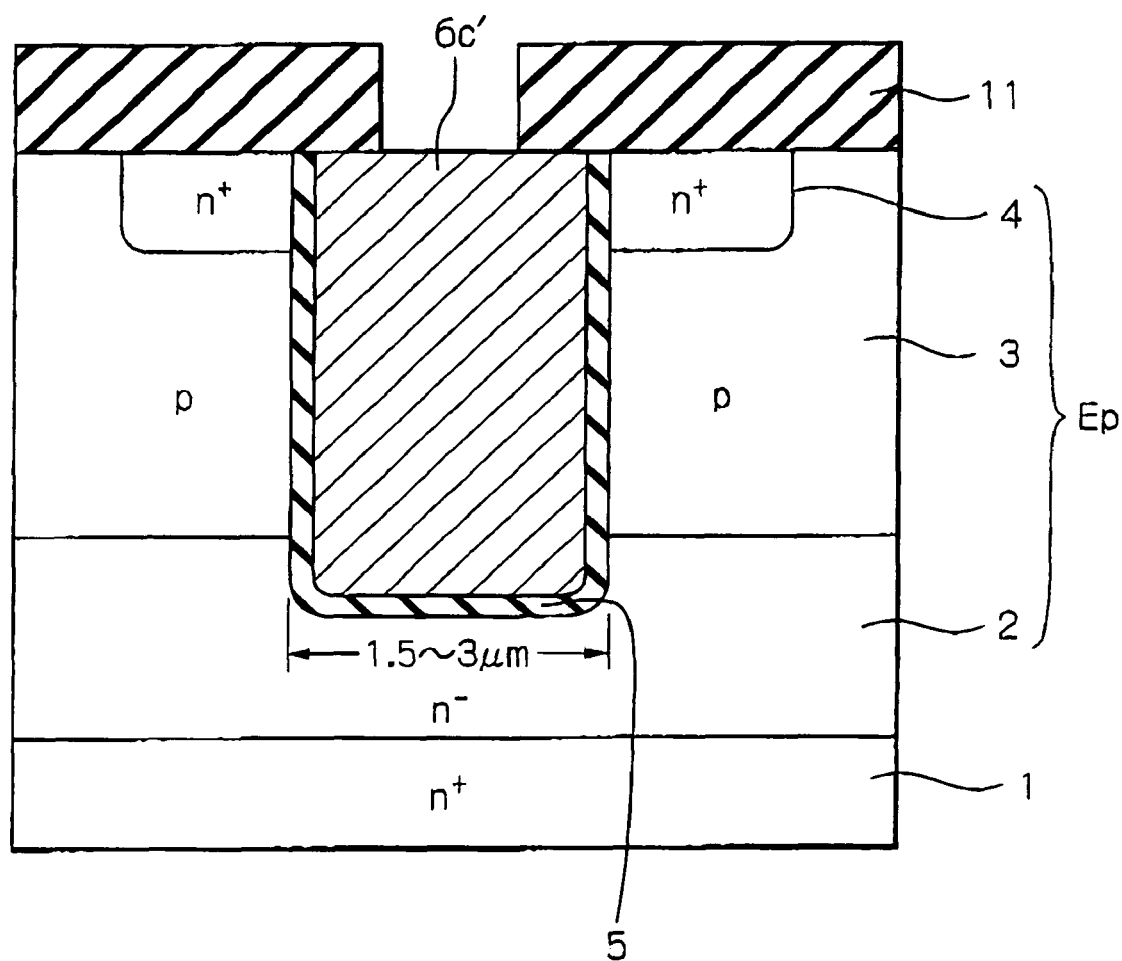

Next, referring to FIG. 7E, a silicon dioxide pattern layer 11 is formed by a CVD process, and a photolithography and etching process.

Figure 7F:
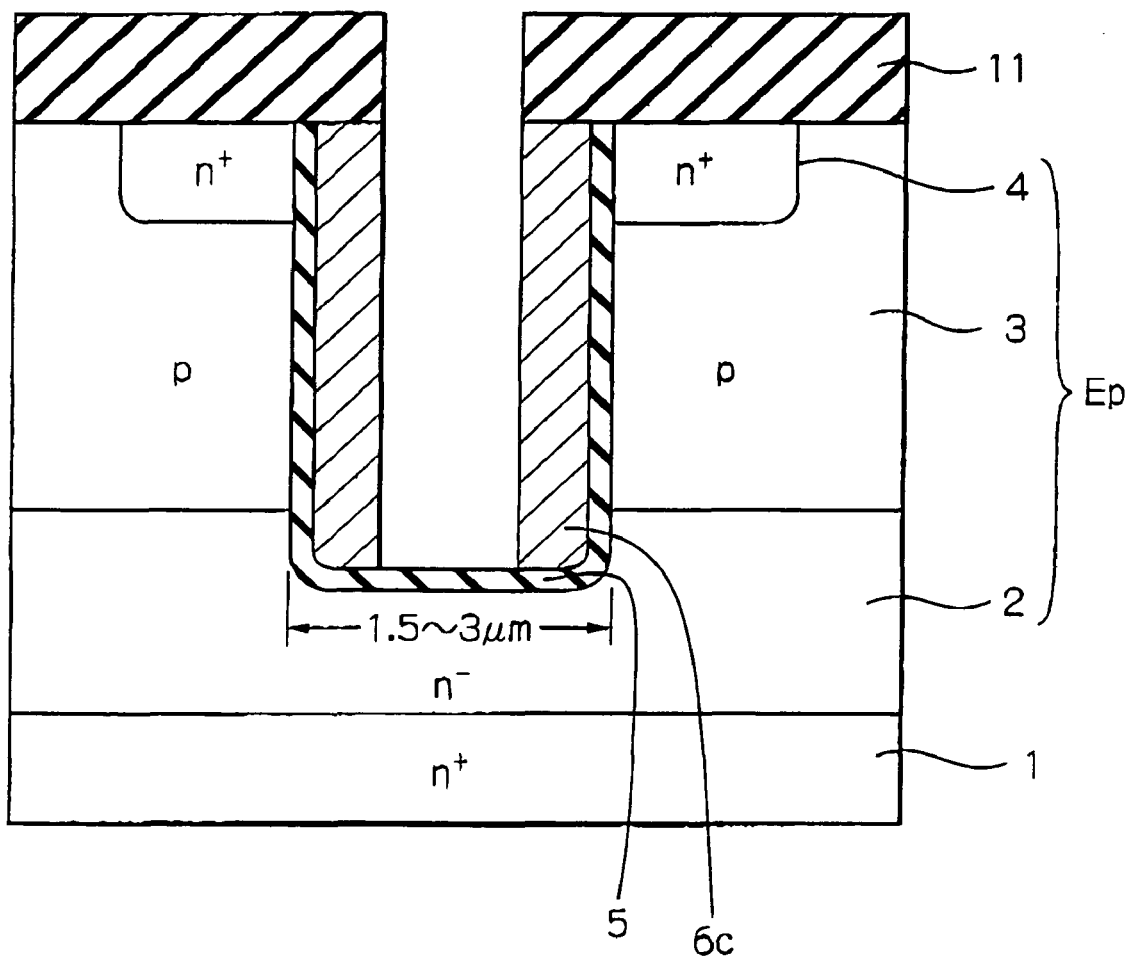

Next, referring to FIG. 7F, the polycrystalline silicon layer 6c' is etched by an anisotropic etching process using the silicon dioxide pattern layer 11 as a mask, so that a gate electrode 6c is obtained on the gate silicon dioxide layer 5 on the side of the U-shaped trench T. In this case, the gate silicon dioxide layer 5 at the bottom of the U-shaped trench T serves as an etching stopper. Then, the silicon dioxide pattern layer 11 is removed.

Figure 7G:
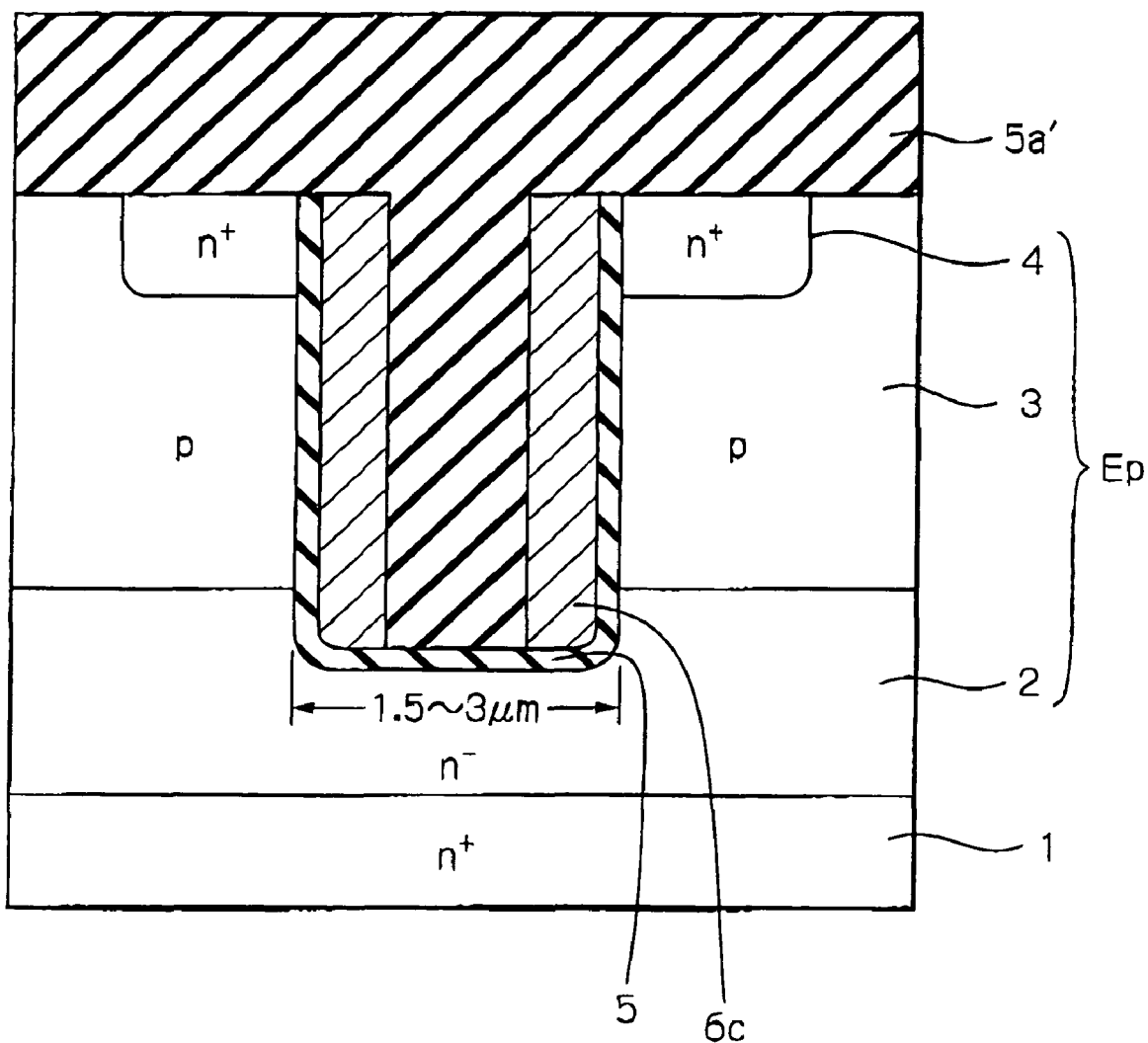

Next, referring to FIG. 7G, a silicon dioxide layer 5a' is deposited on the entire surface by a low pressure CVD process.

Figure 7H:
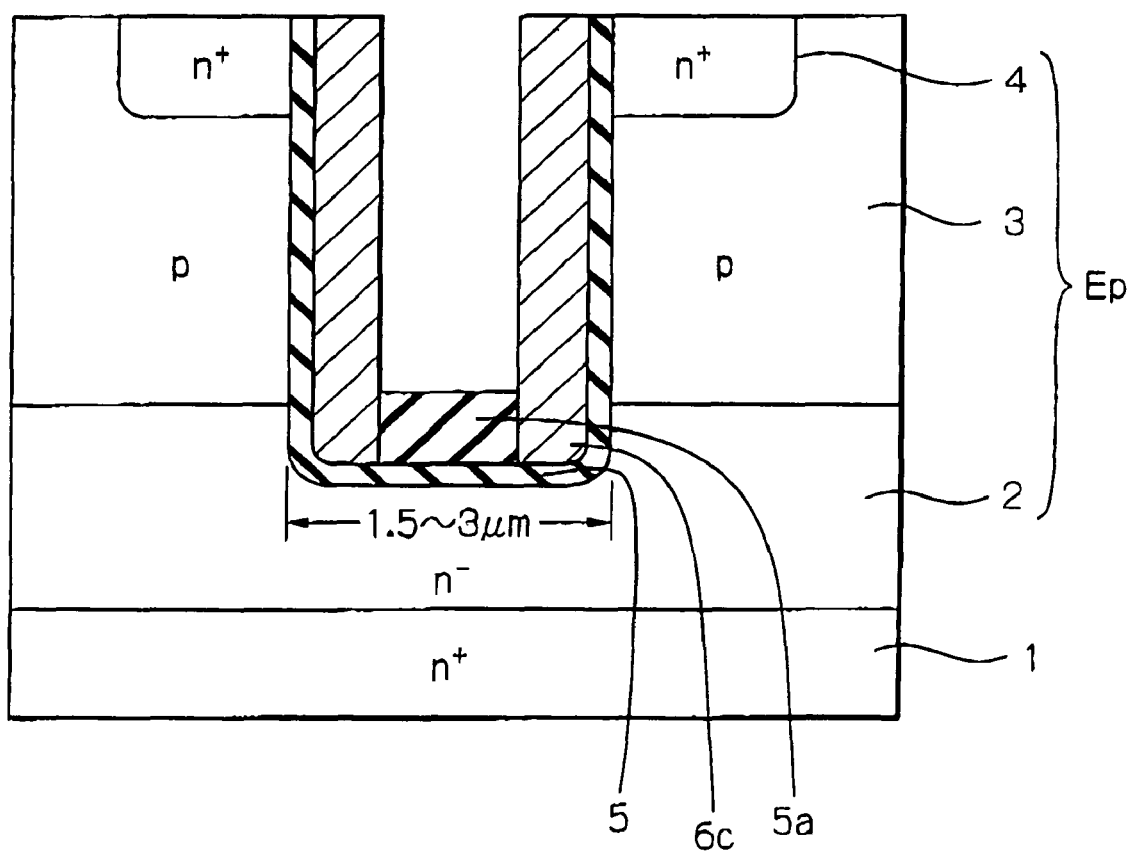

Next, referring to FIG. 7H, the silicon dioxide layer 5a' is etched back by an anisotropic etching process. As a result, a silicon dioxide layer 5a is left at the bottom of the U-shaped trench T.

Figure 7I:
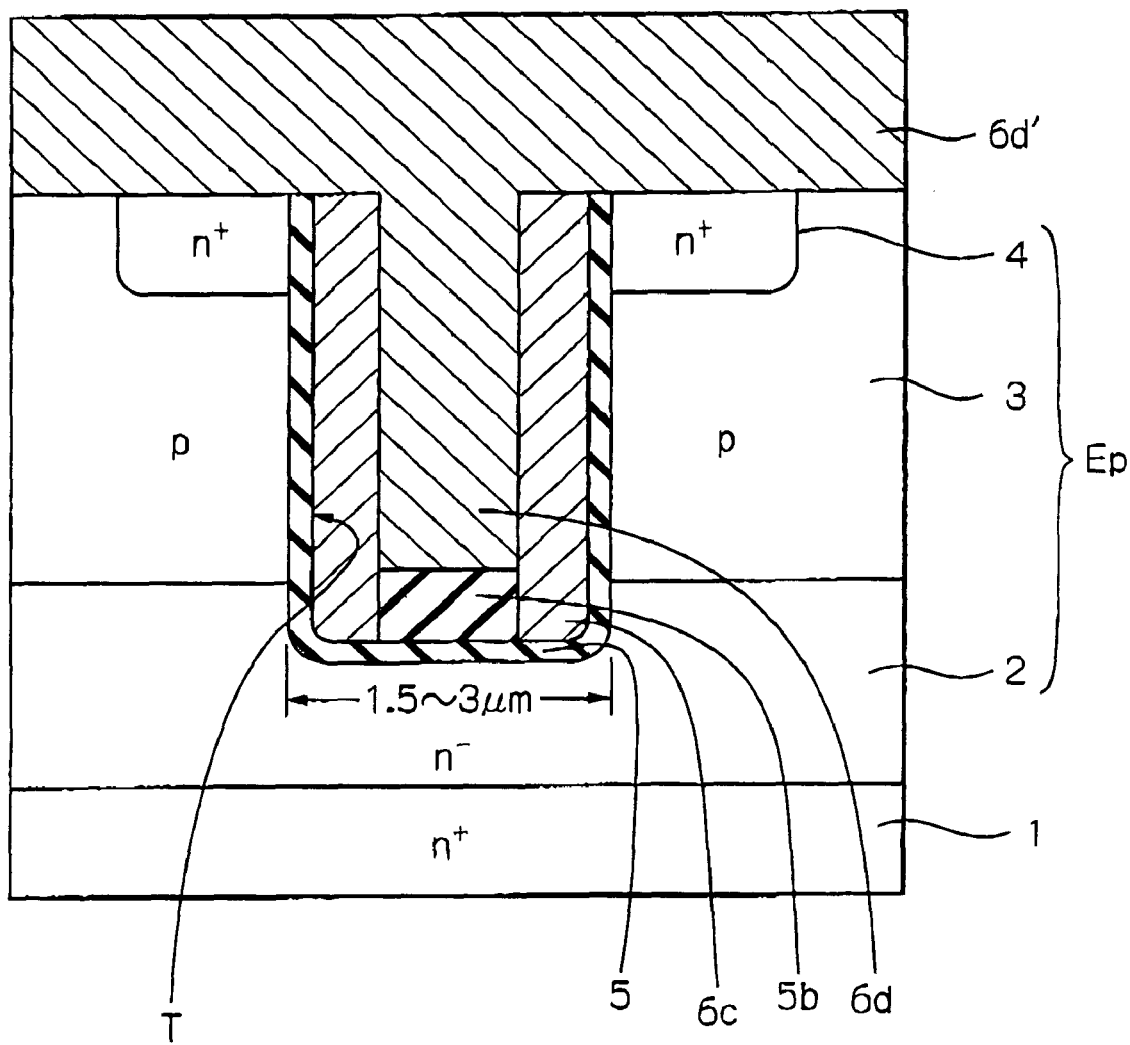

Next, referring to FIG. 7I, a tungsten layer 6d' is deposited on the entire surface by a sputtering process.

Figure 7J:
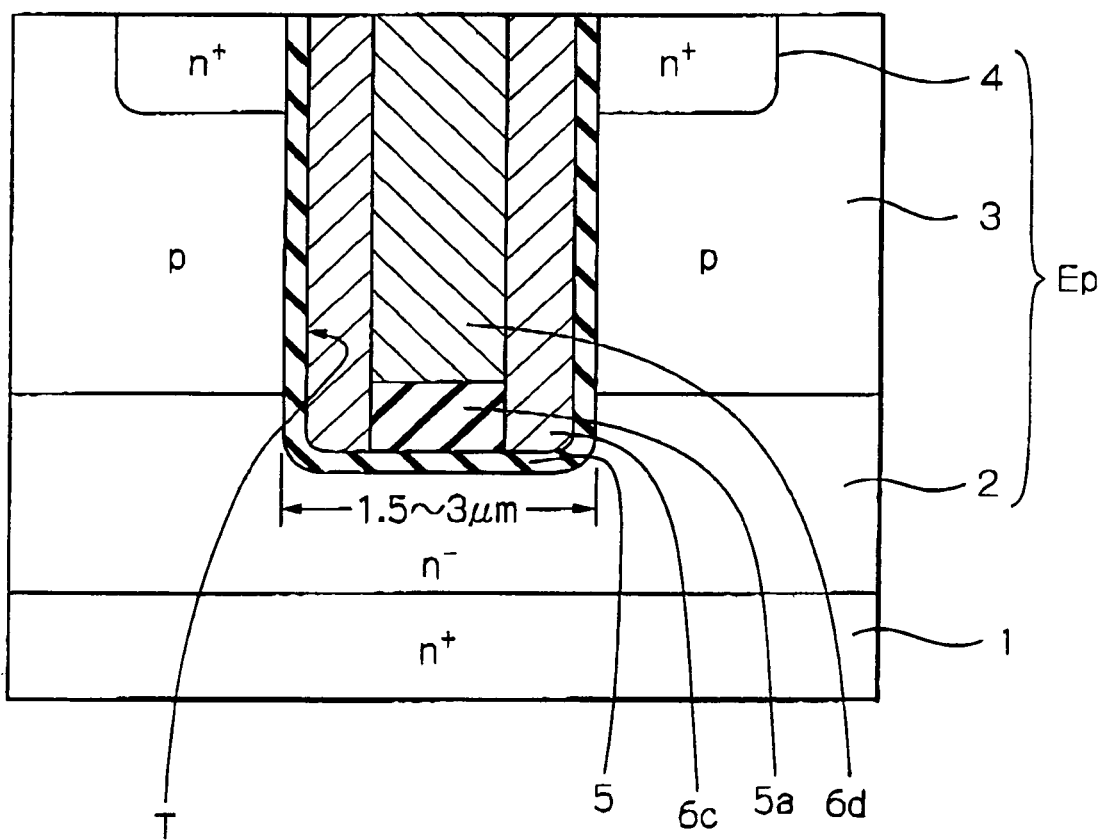

Next, referring to FIG. 7J, the tungsten layer 6d' is etched back by an anisotropic etching process. As a result, a gate electrode 6d, which is in contact with the gate electrode 6c and the silicon dioxide layer 5a, is obtained.

Thereafter, an insulating interlayer 7, a source electrode 8 and a drain electrode 9 are formed to complete the MOSFET of FIG. 6.

Thus, the method of FIG. 6 is so complex that the manufacturing cost would be high. Particularly, the gate electrode 6c is formed by the etching back process as illustrated in FIG. 7D, the photolithography process as illustrated in FIG. 7E and the etching process as illustrated in FIG. 7F, which would make the manufacturing steps complex. Also, the gate electrode 6d is formed by the etching back process as illustrated in FIG. 7J without an etching stopper, i.e., the gate silicon dioxide layer 5, which would overetch the epitaxial layer $E_P$, i.e., the $n^+$-type source region 4 and the p-type base region 3.

Note that, when the etching back process as illustrated in FIG. 7D is carried out, the gate silicon dioxide layer 5 on the epitaxial layer $E_P$ can be left as an etching stopper. However, the gate silicon dioxide layer 5 left on the epitaxial layer $E_P$ is removed simultaneously with the removal of the silicon dioxide layer 11 as illustrated in FIG. 7E or simultaneously with the etching back process of the silicon dioxide layer 5a' as illustrated in FIG. 7H. Therefore, when the etching back process as illustrated in FIG. 7J is carried out, there is no etching stopper on the epitaxial layer $E_P$.

If an etching stopper is formed only on the epitaxial layer $E_P$ before the deposition of the tungsten layer 6d' as illustrated in FIG. 7I, the manufacturing steps become more complex.

In FIG. 8, which illustrates an embodiment of the trench-type vertical MOSFET according to the present invention, the silicon dioxide layer 5a of FIG. 6 is replaced by an insulating layer 5b which excludes silicon dioxide. For example, the insulating layer 5b is made of silicon nitride (SiN) or silicon oxynitride (SiON). That is, the insulating layer 5b has different etching characteristics from those of silicon dioxide. As a result, the etching back process of this insulating layer 5b makes use of the gate silicon dioxide layer 5 as an etching stopper, so that the epitaxial layer $E_P$ is hardly overetched.

Also, silicon dioxide has a dielectric constant of about 3.8 to 4.0, while silicon nitride and silicon oxynitride have dielectric constants of about 7.5 and about 6.5, respectively. As a result, the static gate-to-drain capacitance $C_{gd}$ is slightly increased as compared with the MOSFET of FIG. 6, which would slightly decrease the switching operation speed. However, even in this case, since the static gate-to-drain capacitance is much smaller than those of the MOSFETs of FIGS. 2 and 4 by the insulating layer 5b, the switching operation speed is increased. That is, the switching operation speed of the MOSFET of FIG. 8 is equivalent to that of the MOSFET of FIG. 6.

Also, the gate electrodes 6c and 6d are formed by different manufacturing steps from those for the gate electrodes 6c and 6d of FIG. 6. That is, the manufacturing steps of the gate electrode 6c is much simpler than those of the gate electrode 6c of FIG. 6. On the other hand, since the insulating layer 5b is made of material different from silicon dioxide, the gate electrode 6d is formed by an etching back process using the gate silicon dioxide layer 5 as an etching stopper, so that the epitaxial layer $E_P$ is not overetched.

A method for manufacturing the MOSFET of FIG. 8 is explained next with reference to FIGS. 9A through 9I.

Figure 9A:
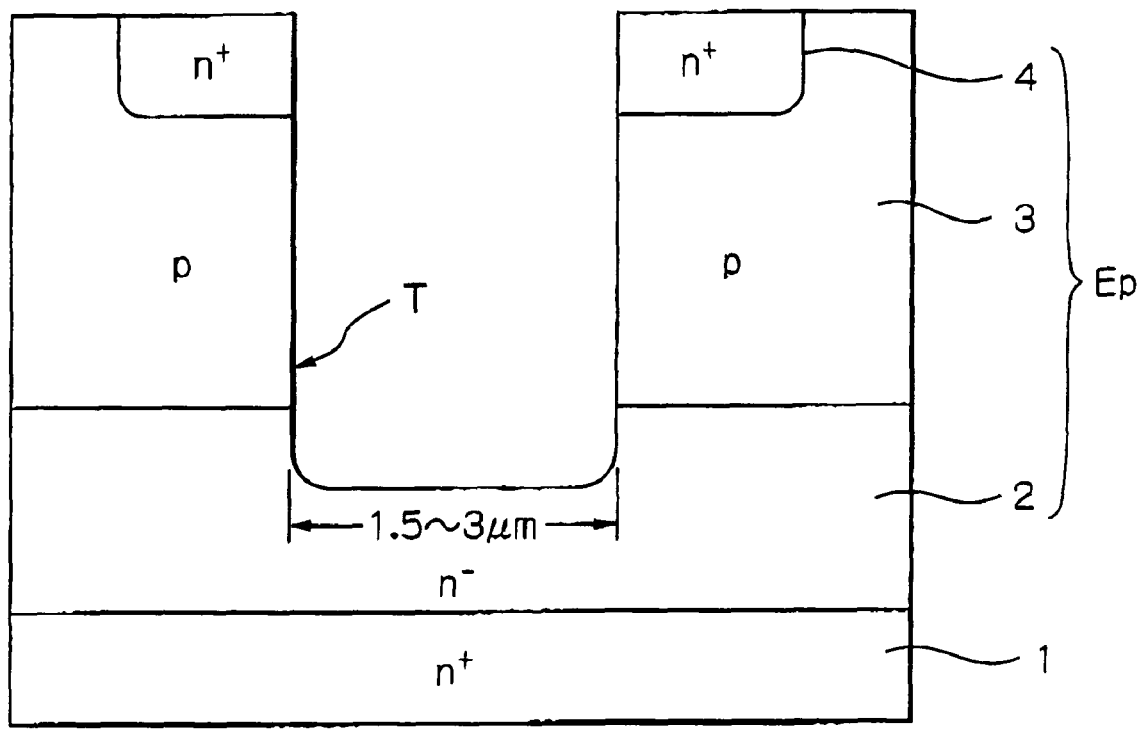
FIGS. 9A through 9I are cross-sectional views for explaining a method for manufacturing the MOSFET of FIG. 8.

First, referring to FIG. 9A, in the same way as in FIG. 7A, a semiconductor wafer where an epitaxial layer $E_P$ formed by an $n^-$-type drain region 2, a p-type base region 3 and an $n^+$-type source region 4 is formed on an $n^+$-type monocrystalline silicon substrate 1 is prepared. Then, a U-shaped trench T is formed within the epitaxial layer $E_P$.

Figure 9B:
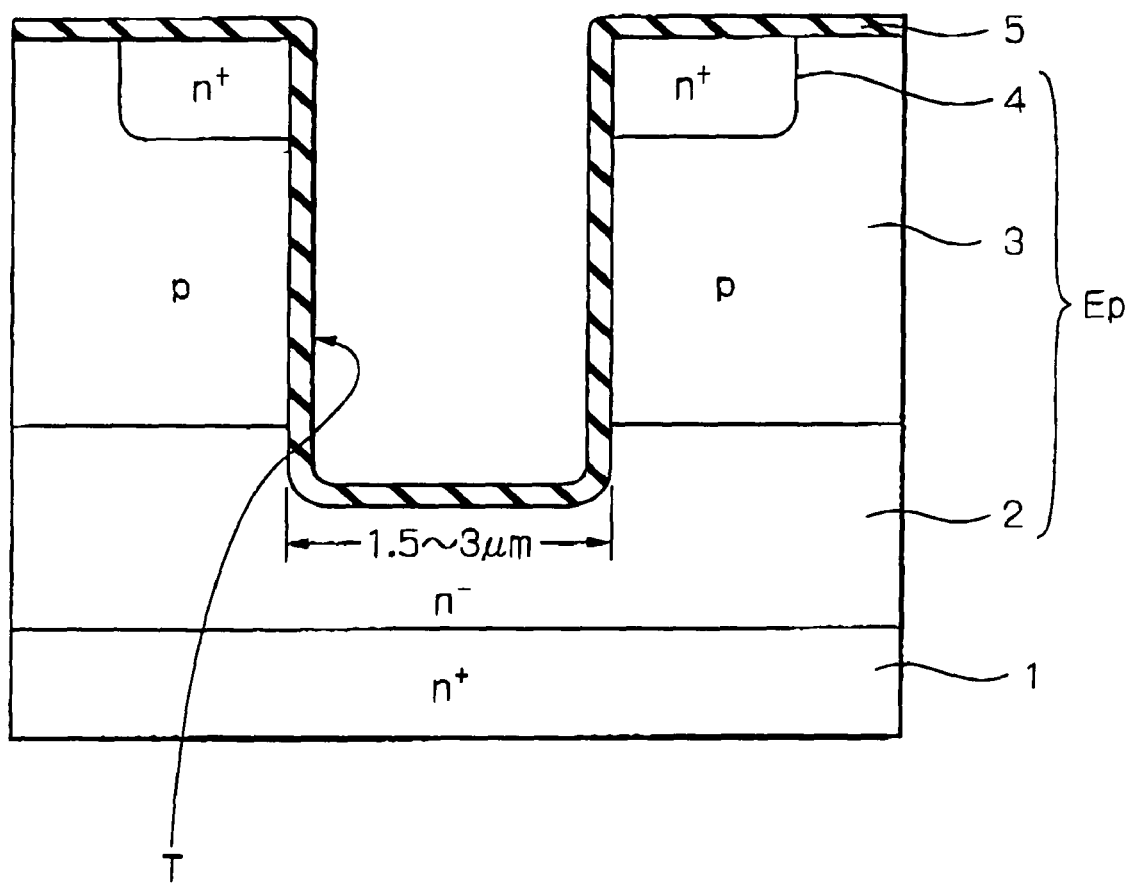

Next, referring to FIG. 9B, in the same way as in FIG. 7B, a gate silicon dioxide layer 5 is thermally grown on the epitaxial layer $E_P$.

Figure 9C:
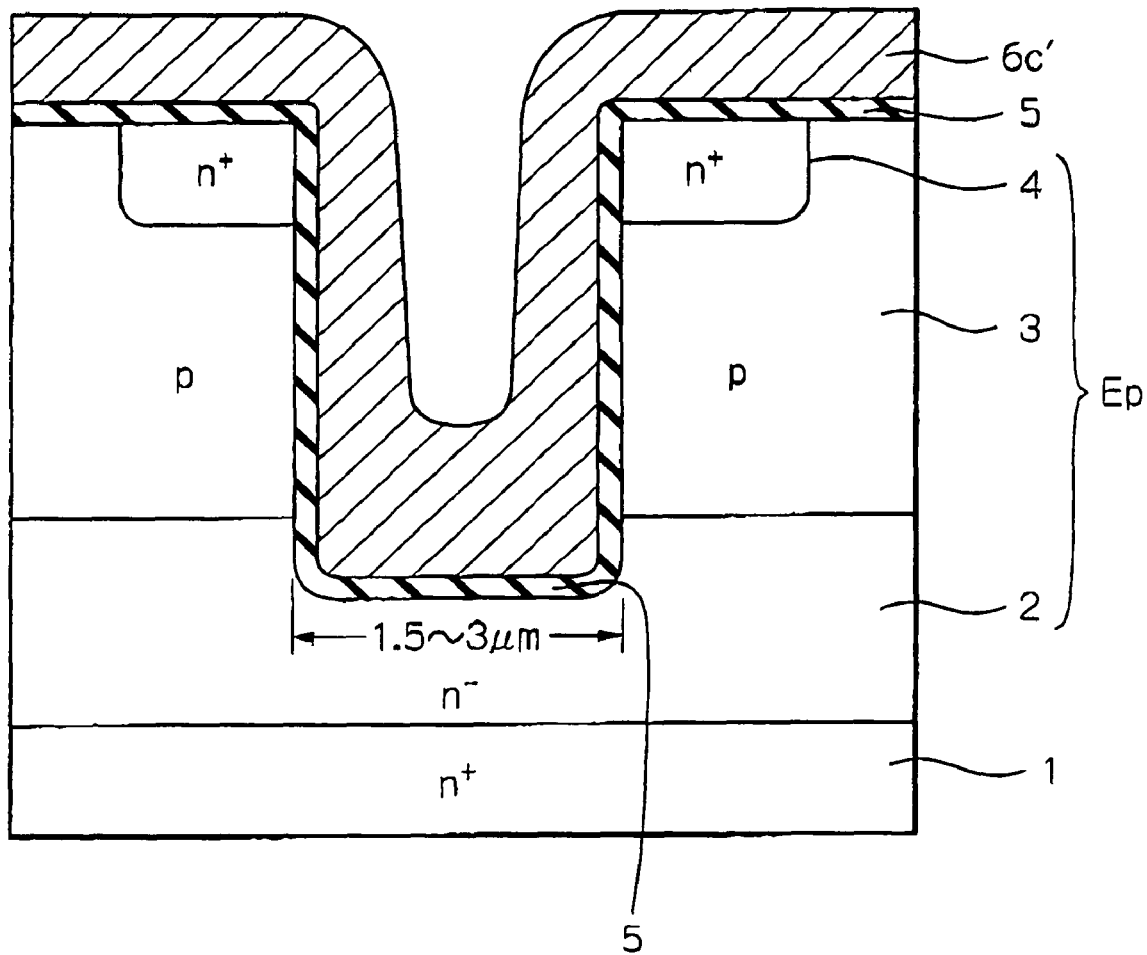

Next, referring to FIG. 9C, in a similar to FIG. 7C, a phosphorus-doped polycrystalline silicon layer 6c' is deposited on the gate silicon dioxide layer 5 by a CVD process.

Figure 9D:
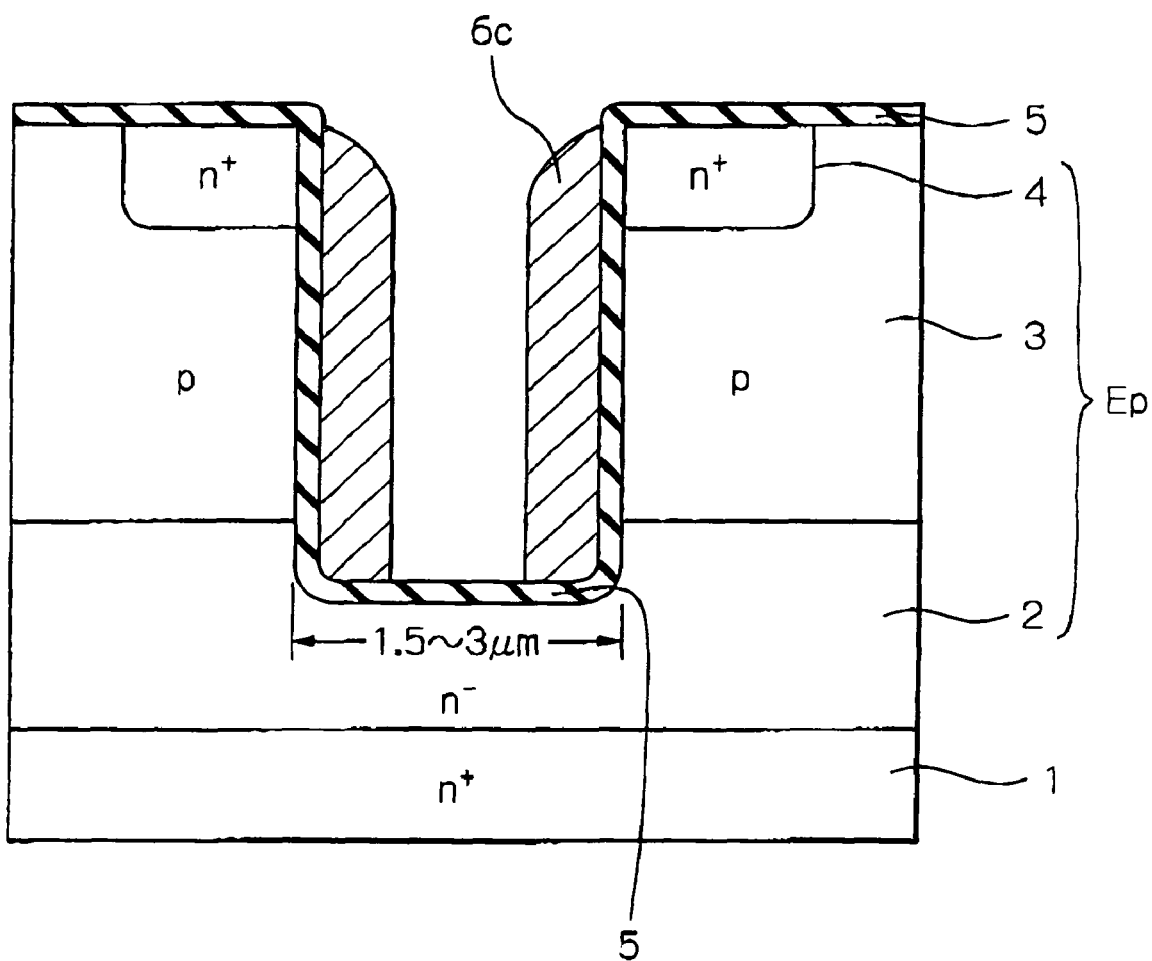

Next, referring to FIG. 9D, the polycrystalline silicon layer 6c' is etched back by an anisotropic etching process. As a result, a polycrystalline silicon layer 6c is obtained on the gate silicon dioxide layer 5 on the side of the U-shaped trench T. In this case, the gate silicon dioxide layer 5 at the bottom of the U-shaped trench T and on the epitaxial layer $E_P$ serves as an etching stopper.

Figure 9E:
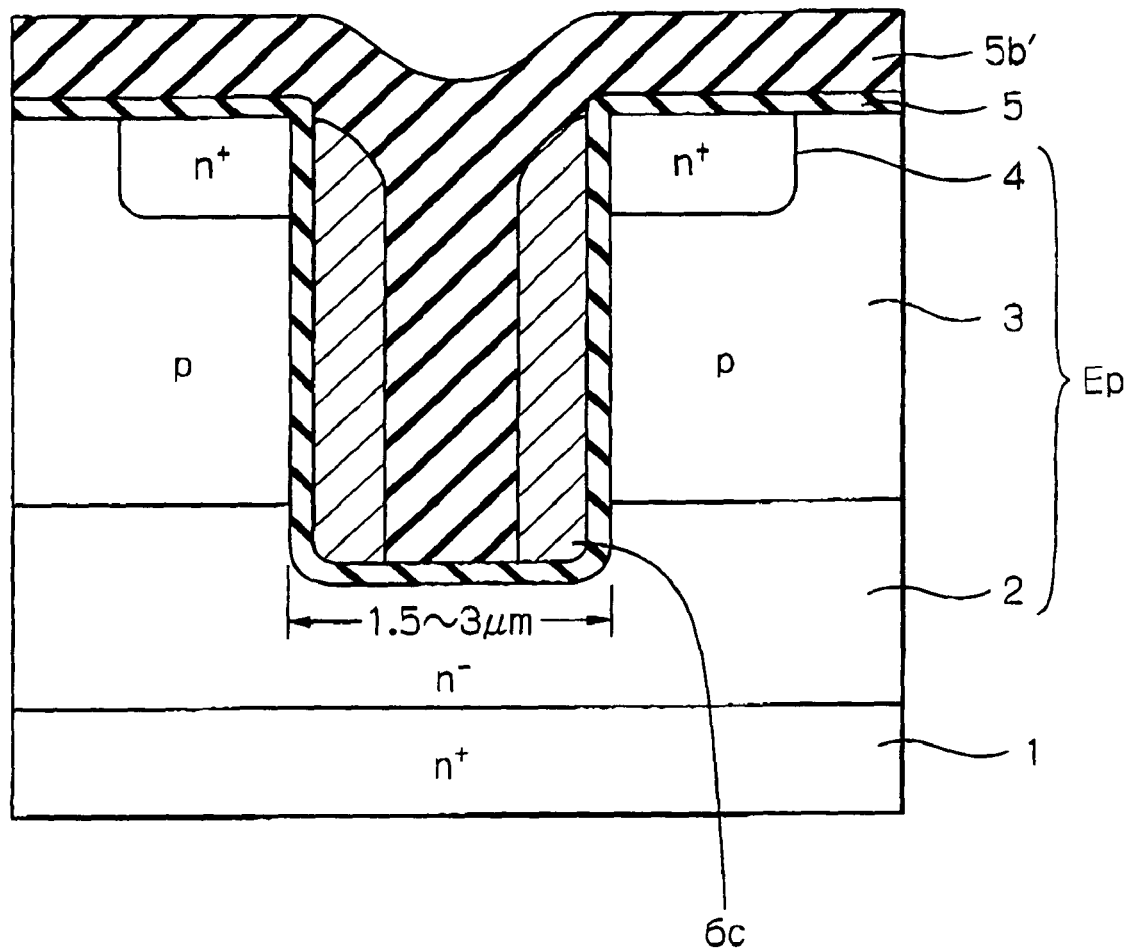

Next, referring to FIG. 9E, an insulating layer 5b' made of silicon nitride or silicon oxynitride is deposited on the entire surface by a CVD process.

Figure 9F:
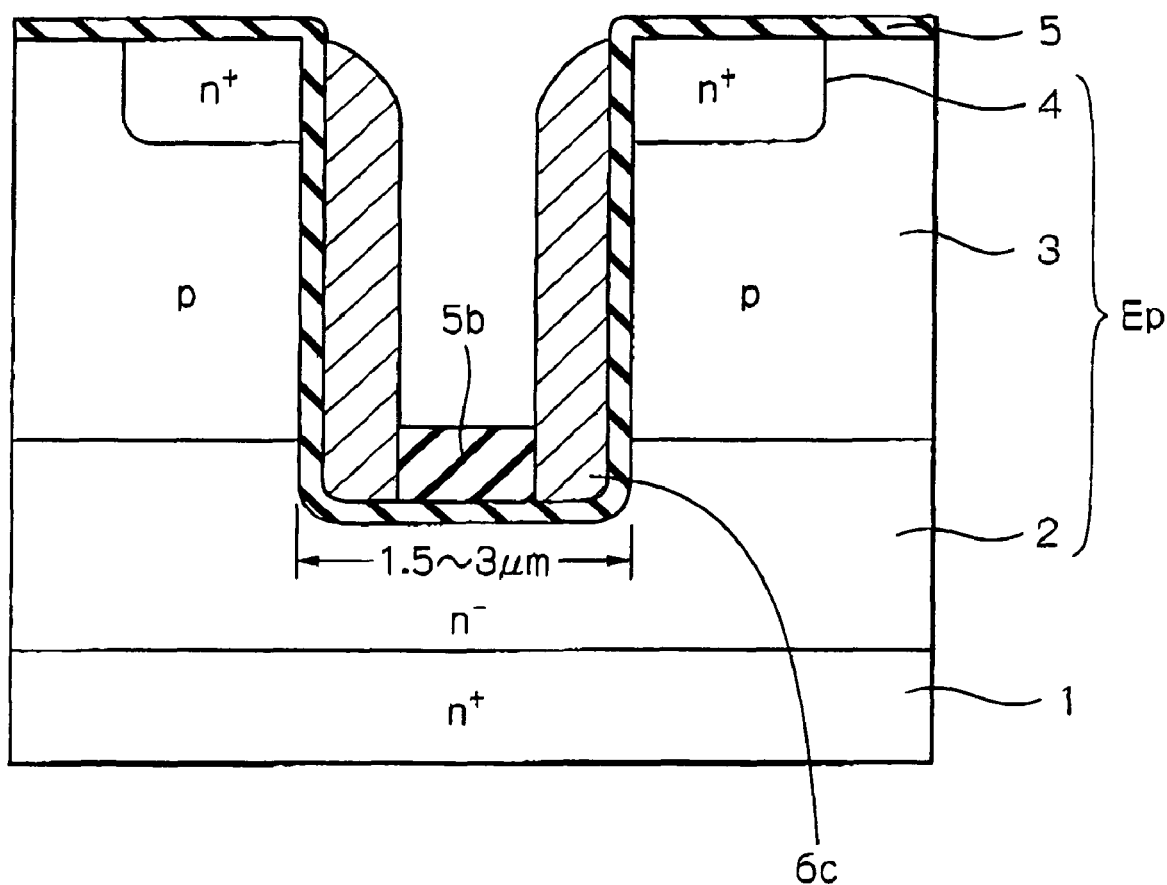

Next, referring to FIG. 9F, the insulating layer 5b' is etched back by an anisotropic etching process using the gate silicon dioxide layer 5 on the epitaxial layer $E_P$ as an etching stopper. As a result, an insulating layer 5b is left at the bottom of the U-shaped trench T.

Note that, since the insulating layer 5b' has different etching characteristics from those of silicon dioxide, the gate silicon dioxide layer 5 on the epitaxial layer $E_P$ is not etched by the above-mentioned anisotropic etching process.

Figure 9G:
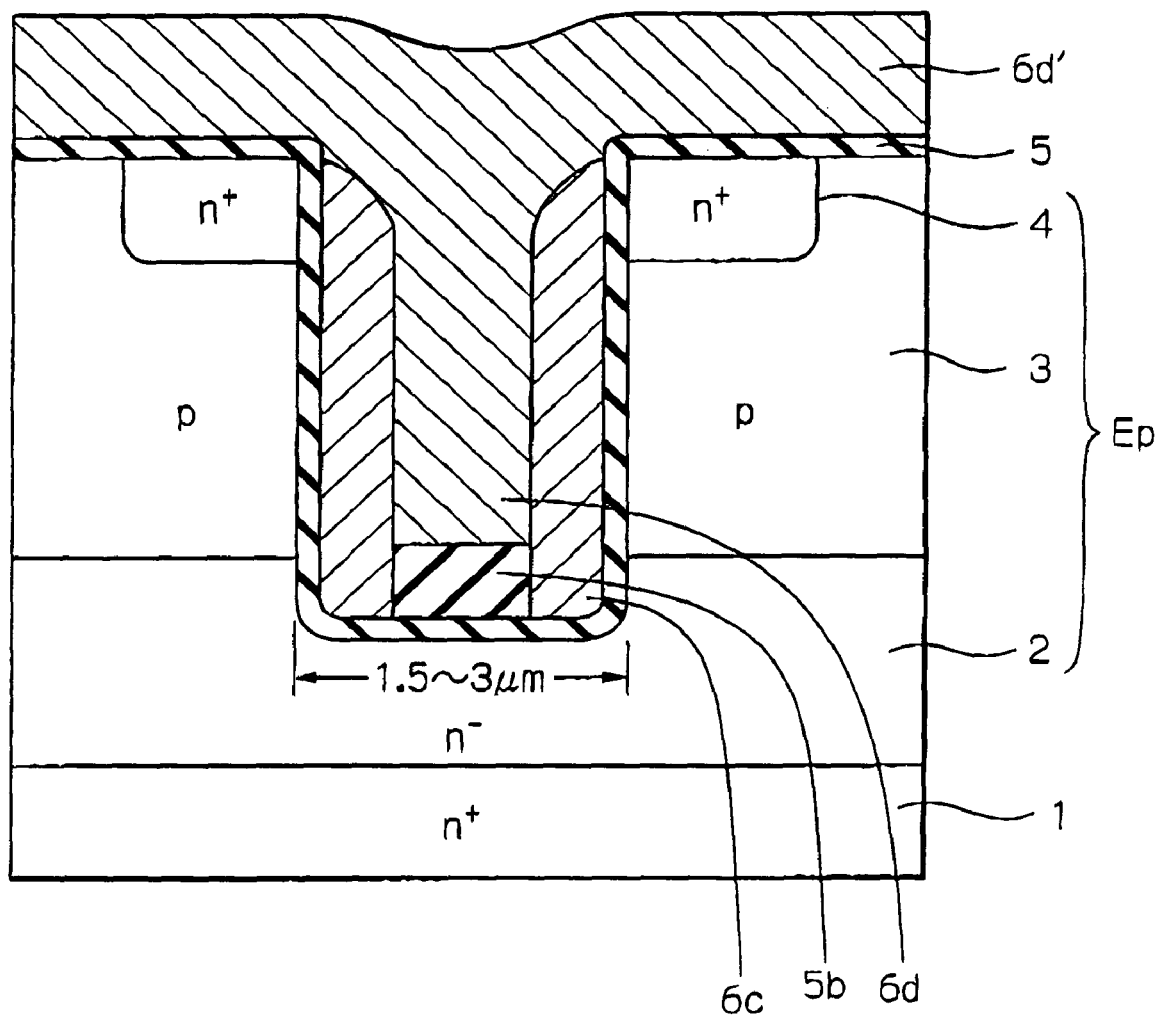

Next, referring to FIG. 9G, in the same way as in FIG. 7I, a tungsten layer 6d' is deposited on the entire surface by a sputtering process.

Figure 9H:
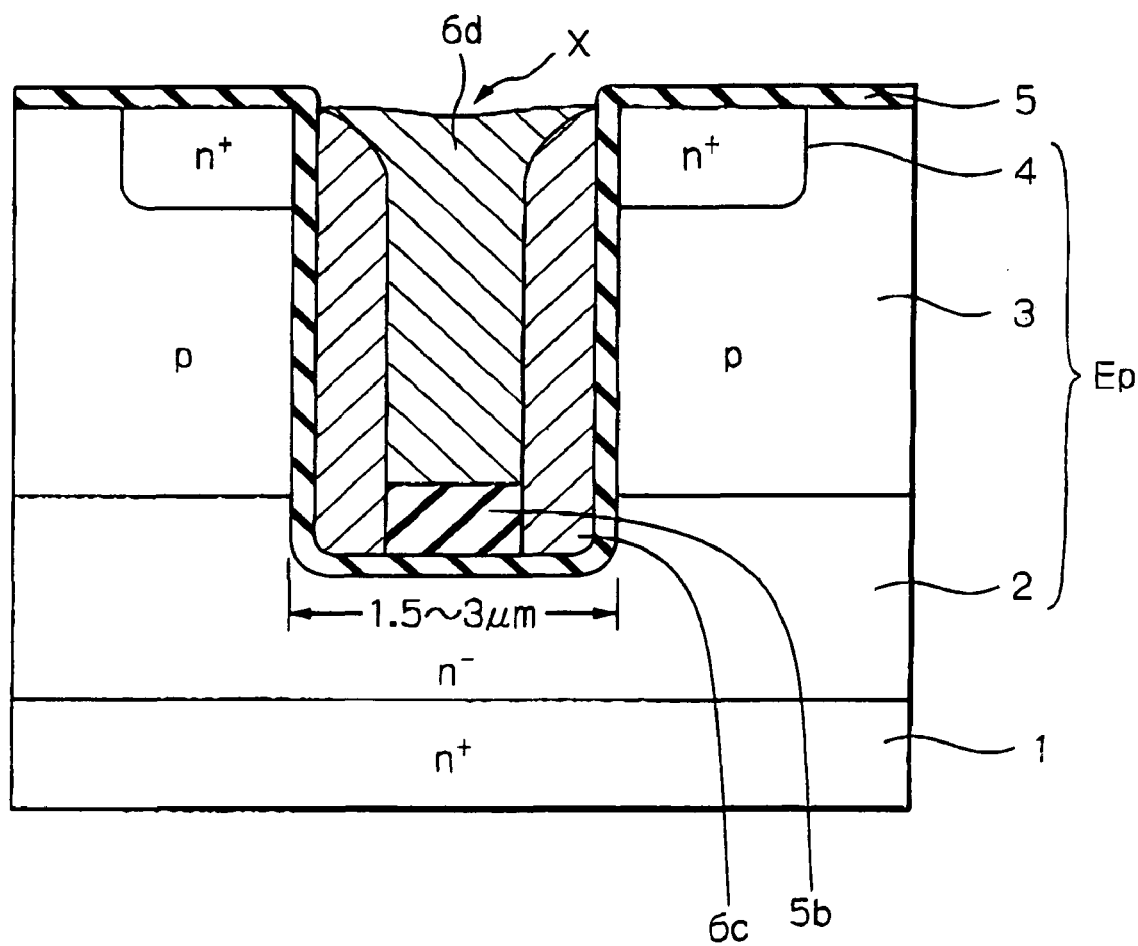

Next, referring to FIG. 9H, the tungsten layer 6d' is etched by an anisotropic etching process using the gate silicon dioxide layer 5 as an etching stopper. As a result, a gate electrode 6d, which is in contact with the gate electrode 6c and the insulating layer 5b, is obtained. As a result, the epitaxial layer $E_P$ is not overetched by the above-mentioned anisotropic etching process.

Figure 9I:
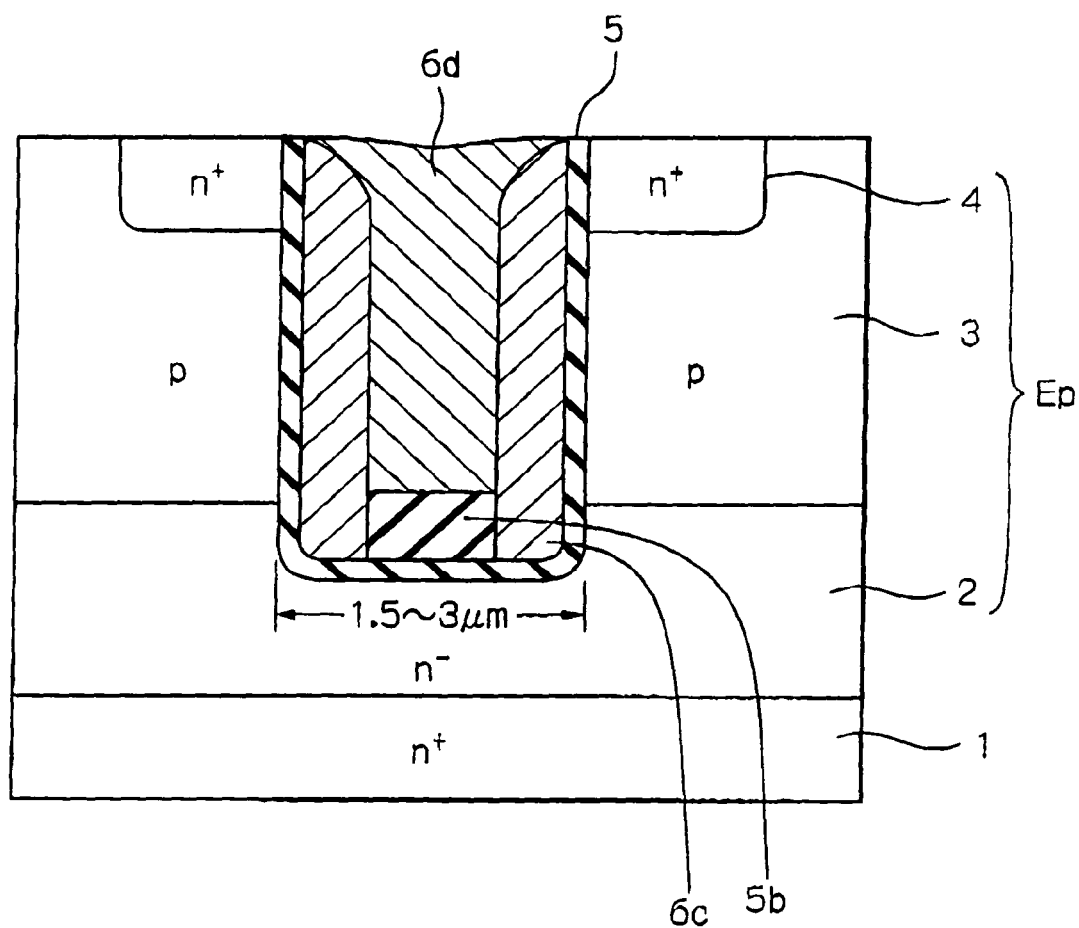

Next, referring to FIG. 9I, the gate silicon dioxide layer 5 on the epitaxial layer $E_P$ is removed.

Thereafter, an insulating interlayer 7, a source electrode 8 and a drain electrode 9 are formed to complete the MOSFET of FIG. 8.

Note that the thickness of the insulating layer 5b is optimized. If the insulating layer 5b is too thin, the static gate-to-drain capacitance $C_{gd}$ is not so small and the surface of the gate electrode 6d is too uneven as indicated by X in FIG. 9H. On the other hand, if the insulating layer 5b is too thick, the contact area between the gate electrodes 6c and 6d is decreased to increase the gate resistance.

Thus, the manufacturing method as illustrated in FIGS. 9A through 9H, the gate electrode 6c is obtained by only the etching back process as illustrated in FIGS. 9C and 9D, without the photolithography and etching process as illustrated in FIGS. 7E and 7F. Also, the gate electrode 6d is obtained by the etching back process as illustrated in FIGS. 9G and 9H where the gate silicon dioxide layer 5 serves as an etching stopper, so that the epitaxial layer $E_P$ is not overetched. Therefore, the manufacturing steps are simplified as compared with those of FIGS. 7A through 7J.

In FIGS. 9G and 9H, although refractory metal such as tungsten is used for the gate electrode 9d, which is helpful in decreasing the gate resistance. However, polycrystalline silicon can also be used. In this case, since the gate electrode 6c is also made of polycrystalline silicon, the manufacturing apparatus can be common to decrease the manufacturing cost.

The present invention can be applied to a trench-type vertical MOSFET where a $p^-$-type epitaxial layer is grown on a $p^+$-type monocrystalline silicon substrate, and a n-type base region and a $p^+$-type source region are formed by implanting n-type impurities and p-type impurities, respectively, into the $p^-$-type epitaxial layer.

Also, the present invention can be applied to a semiconductor device where triple diffusion processes are performed upon a semiconductor substrate. For example, n-type impurities are implanted into a deep portion of an $n^+$-type monocrystalline silicon substrate to form an $n^-$-type drain region therein. Then, p-type impurities are implanted into a medium portion of the substrate to form a p-type base region. Further, n-type impurities are implanted into a shallow portion of the substrate to form an $n^+$-type source region.

Further, the present invention can be applied to an insulated gate bipolar transistor (IGBT).

The invention claimed is:

1. A method for manufacturing a semiconductor device comprising:
    forming a trench in a semiconductor wafer;
    forming a gate silicon dioxide layer on an entire surface of said semiconductor wafer;
    depositing a first gate layer on said gate silicon dioxide layer;
    etching back said first gate layer to form a first gate electrode on a sidewall of the trench of said semiconductor wafer via said gate silicon dioxide layer;
    depositing an insulating layer on an entire surface of said semiconductor wafer after said first gate electrode is formed, said insulating layer excluding silicon dioxide and having different etching characteristics from those of silicon dioxide;
    etching back said insulating layer using said gate silicon dioxide layer as an etching stopper, so that said insulating layer is left on a bottom of the trench of said semiconductor wafer via said gate silicon dioxide layer and is surrounded by said first gate electrode;
    forming a second gate electrode layer on an entire surface of said semiconductor wafer after said insulating layer is etched back; and
    etching back said second gate electrode layer using said gate silicon dioxide layer as an etching stopper to form a second gate electrode buried in the trench of said semiconductor wafer, said second gate electrode being in contact with said first gate electrode and said insulating layer.

2. The method as set forth in claim 1, wherein said semiconductor wafer comprises:
    a semiconductor substrate;
    an epitaxial semiconductor layer grown on said semiconductor substrate, said epitaxial semiconductor layer having the trench of said semiconductor wafer.

3. The method as set forth in claim 1, wherein said semiconductor wafer comprises a semiconductor substrate having impurity diffusion regions,
    the trench of said semiconductor wafer being formed within said impurity diffusion regions.

4. The method as set forth in claim 1, wherein said insulating layer comprises one of a silicon nitride layer and a silicon oxynitride layer.

5. The method as set forth in claim 1, wherein said first gate electrode comprises a polycrystalline silicon layer, and said second gate electrode layer comprises one of a polycrystalline silicon layer and a refractory metal layer.

* * * * *